(12) United States Patent
Yang et al.

(10) Patent No.: US 11,671,117 B2
(45) Date of Patent: Jun. 6, 2023

(54) SEQUENCE INTERLEAVING FOR CONVEYING MULTI-BIT PAYLOADS

(71) Applicant: QUALCOMM incorporated, San Diego, CA (US)

(72) Inventors: Wei Yang, San Diego, CA (US); Yi Huang, San Diego, CA (US); Peter Gaal, San Diego, CA (US); Wanshi Chen, San Diego, CA (US); Seyedkianoush Hosseini, San Diego, CA (US); Hwan Joon Kwon, San Diego, CA (US); Krishna Kiran Mukkavilli, San Diego, CA (US); Tingfang Ji, San Diego, CA (US); Juan Montojo, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 51 days.

(21) Appl. No.: 17/209,811

(22) Filed: Mar. 23, 2021

(65) Prior Publication Data

US 2021/0320674 A1    Oct. 14, 2021

Related U.S. Application Data

(60) Provisional application No. 63/008,390, filed on Apr. 10, 2020.

(51) Int. Cl.
*H03M 13/27* (2006.01)
*H04L 27/26* (2006.01)
*H04L 1/00* (2006.01)

(52) U.S. Cl.
CPC ..... *H03M 13/271* (2013.01); *H03M 13/2778* (2013.01); *H04L 1/0071* (2013.01); *H04L 27/2607* (2013.01)

(58) Field of Classification Search
CPC ............ H03M 13/271; H03M 13/2778; H04L 1/0071; H04L 27/2607; H04L 27/26025; H04L 5/0044; H04L 1/0041; H04J 13/00
See application file for complete search history.

(56) References Cited

U.S. PATENT DOCUMENTS

| | | | |
|---|---|---|---|
| 2002/0159506 A1 | 10/2002 | Alamouti et al. | |
| 2006/0274710 A1* | 12/2006 | Lim | H04J 13/12 370/342 |

(Continued)

OTHER PUBLICATIONS

International Search Report and Written Opinion—PCT/US2021/023893—ISA/EPO—dated Jul. 1, 2021.

(Continued)

*Primary Examiner* — Thien Nguyen
(74) *Attorney, Agent, or Firm* — Holland & Hart LLP

(57) ABSTRACT

Methods, systems, and devices for wireless communications are described. A communication device, otherwise known as a user equipment (UE) or a base station may select a sequence from a set of sequences for conveying a payload including a set of bits. A length of the selected sequence may be based on a number of time periods for conveying the payload and a number of frequency tones for conveying the payload. The communication device may apply an interleaving function to the selected sequence to generate an interleaved sequence, and transmit the payload including the set of bits using the interleaved sequence. Likewise, the communication device may receive the payload including the set of bits using an interleaved sequence, and apply an interleaving function to de-interleave the interleaved sequence to generate a selected sequence. The communication device may thereby decode the payload based on the selected sequence.

30 Claims, 15 Drawing Sheets

(56) References Cited

U.S. PATENT DOCUMENTS

2008/0101440 A1* 5/2008 Lee ................ H04L 5/0016
375/141
2016/0020865 A1* 1/2016 Byoung-Hoon ......... H04J 3/00
370/335

OTHER PUBLICATIONS

Velazquez-Gutierrez J.M., et al., "Sequence Sets in Wireless Communication Systems: A Survey," IEEE Communications Surveys & Tutorials, vol. 19. No. 2, May 31, 2017 (May 31, 2017), pp. 1225-1248, XP011651808, DOI:10.1109/COMST.2016.2639739, [retrieved on Jun. 2, 2017] abstract.

* cited by examiner $$W = \frac{1}{\sqrt{N}} \begin{bmatrix} 1 & 1 & 1 & 1 & \cdots & 1 \\ 1 & \omega & \omega^2 & \omega^3 & \cdots & \omega^{N-1} \\ 1 & \omega^2 & \omega^4 & \omega^6 & \cdots & \omega^{2(N-1)} \\ 1 & \omega^3 & \omega^6 & \omega^9 & \cdots & \omega^{3(N-1)} \\ \vdots & \vdots & \vdots & \vdots & \ddots & \vdots \\ 1 & \omega^{N-1} & \omega^{2(N-1)} & \omega^{3(N-1)} & \cdots & \omega^{(N-1)(N-1)} \end{bmatrix}$$

Column $n$, Row $n$ 300-a

FIG. 3A $$S(m) = \begin{bmatrix} S(M-1)\, e^{j2\pi(M-1)m/M} \\ \vdots \\ S(l)\, e^{j2\pi l m/M} \\ \vdots \\ S(2)\, e^{j2\pi 2 m/M} \\ S(1)\, e^{j2\pi 1 m/M} \\ S(0)\, e^{j2\pi 0 m/M} \end{bmatrix}$$

Tone Index

Tone Index $l$ 300-b

FIG. 3B

Sequence 405 = $[a_0, a_1, a_2, a_3, a_4, a_5, a_6, a_7, a_8, \ldots a_{(K-1)}]$ Virtual Matrix 410

$$\begin{bmatrix} a_0 & a_3 & a_6 \\ a_1 & a_4 & a_7 & \cdots \\ a_2 & a_5 & a_8 \end{bmatrix}$$

Row Interleaving 415

$$\begin{bmatrix} a_1 & a_4 & a_7 \\ a_0 & a_3 & a_6 & \cdots \\ a_2 & a_5 & a_8 \end{bmatrix}$$

Column Interleaving 420

$$\begin{bmatrix} a_3 & a_0 & a_6 \\ a_4 & a_1 & a_7 & \cdots \\ a_5 & a_2 & a_8 \end{bmatrix}$$

Row + Column Interleaving 425

$$\begin{bmatrix} a_3 & a_4 & a_2 \\ a_1 & a_8 & a_7 & \cdots \\ a_6 & a_0 & a_5 \end{bmatrix}$$

SEQUENCE INTERLEAVING FOR CONVEYING MULTI-BIT PAYLOADS

CROSS REFERENCE

The present application for patent claims the benefit of U.S. Provisional Patent Application No. 63/008,390 by YANG et al., entitled "SEQUENCE INTERLEAVING FOR CONVEYING MULTI-BIT PAYLOADS," filed Apr. 10, 2020, assigned to the assignee hereof, and expressly incorporated by reference herein.

FIELD OF TECHNOLOGY

The following relates generally to wireless communications and more specifically to sequence interleaving for conveying multi-bit payloads.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include one or more base stations or one or more network access nodes, each simultaneously supporting communication for multiple communication devices, which may be otherwise known as user equipment (UE).

SUMMARY

Various aspects of the described techniques relate to configuring a communication device, which may be otherwise known as user equipment (UE) to support sequence-based wireless communications. The UE may, in some cases, experience a Doppler shift or delay spread that may impact the sequence-based wireless communications. To reduce or mitigate the impact of the Doppler shift or delay spread on the sequence-based wireless communications, the UE may be configured to provide sequence interleaving for the sequence-based wireless communications. For example, the UE may be configured to select a sequence (e.g., an orthogonal sequence) to transmit information bits. The UE may apply an interleaving function to the selected sequence to generate an interleaved sequence, and transmit a payload including the information bits using the interleaved sequence. Similarly, a base station may receive a payload including information bits using an interleaved sequence. The base station may apply an interleaving function to de-interleave the interleaved sequence to generate a selected sequence, and decode the payload based on the selected sequence. As a result, the UE may support higher reliability for sequence-based wireless communications in wireless communications systems experiencing a Doppler shift, a delay spread, or both.

A method for wireless communications at a transmitting device is described. The method may include selecting a sequence from a set of multiple sequences for conveying a payload including a set of multiple bits, where a length of the selected sequence is based on a number of one or more time periods for conveying the payload and a number of one or more frequency tones for conveying the payload, applying an interleaving function to the selected sequence to generate an interleaved sequence, and transmitting the payload including the set of multiple bits using the interleaved sequence.

An apparatus for wireless communications at a transmitting device is described. The apparatus may include a processor, memory coupled with the processor, and instructions stored in the memory. The instructions may be executable by the processor to cause the apparatus to select a sequence from a set of multiple sequences for conveying a payload including a set of multiple bits, where a length of the selected sequence is based on a number of one or more time periods for conveying the payload and a number of one or more frequency tones for conveying the payload, apply an interleaving function to the selected sequence to generate an interleaved sequence, and transmit the payload including the set of multiple bits using the interleaved sequence.

Another apparatus for wireless communications at a transmitting device is described. The apparatus may include means for selecting a sequence from a set of multiple sequences for conveying a payload including a set of multiple bits, where a length of the selected sequence is based on a number of one or more time periods for conveying the payload and a number of one or more frequency tones for conveying the payload, means for applying an interleaving function to the selected sequence to generate an interleaved sequence, and means for transmitting the payload including the set of multiple bits using the interleaved sequence.

A non-transitory computer-readable medium storing code for wireless communications at a transmitting device is described. The code may include instructions executable by a processor to select a sequence from a set of multiple sequences for conveying a payload including a set of multiple bits, where a length of the selected sequence is based on a number of one or more time periods for conveying the payload and a number of one or more frequency tones for conveying the payload, apply an interleaving function to the selected sequence to generate an interleaved sequence, and transmit the payload including the set of multiple bits using the interleaved sequence.

Some examples of the method, apparatuses, and non-transitory computer-readable medium described herein may further include operations, features, means, or instructions for identifying the interleaving function based on a table that maps element indices of the selected sequence to element indices of the interleaved sequence.

Some examples of the method, apparatuses, and non-transitory computer-readable medium described herein may further include operations, features, means, or instructions for identifying the interleaving function based on an equation defining the interleaving function.

Some examples of the method, apparatuses, and non-transitory computer-readable medium described herein may further include operations, features, means, or instructions for receiving signaling that indicates the interleaving function.

Some examples of the method, apparatuses, and non-transitory computer-readable medium described herein may further include operations, features, means, or instructions for receiving configuration signaling that configures interleaving for conveying the payload.

In some examples of the method, apparatuses, and non-transitory computer-readable medium described herein, generating, from the selected sequence, a virtual matrix having a number of rows equal to the number of one or more frequency tones for conveying the payload and having a number of columns equal to the number of one or more time periods for conveying the payload.

In some examples of the method, apparatuses, and non-transitory computer-readable medium described herein, applying the interleaving function to the selected sequence may include operations, features, means, or instructions for applying the interleaving function to elements of the selected sequence within columns of the virtual matrix, where a length of the interleaving function may be based on the number of one or more frequency tones for conveying the payload.

In some examples of the method, apparatuses, and non-transitory computer-readable medium described herein, applying the interleaving function to the selected sequence may include operations, features, means, or instructions for applying the interleaving function to elements of the selected sequence within rows of the virtual matrix, where a length of the interleaving function may be based on the number of one or more time periods for conveying the payload.

In some examples of the method, apparatuses, and non-transitory computer-readable medium described herein, applying the interleaving function to the selected sequence may include operations, features, means, or instructions for applying the interleaving function to elements of the selected sequence within rows of the virtual matrix and to elements of the selected sequence within columns of the virtual matrix, where a length of the interleaving function may be based on a product of the number of one or more time periods for conveying the payload and the number of one or more frequency tones for conveying the payload.

Some examples of the method, apparatuses, and non-transitory computer-readable medium described herein may further include operations, features, means, or instructions for mapping the interleaved sequence to physical resources corresponding to the number of one or more time periods for conveying the payload and the number of one or more frequency tones for conveying the payload.

Some examples of the method, apparatuses, and non-transitory computer-readable medium described herein may further include operations, features, means, or instructions for generating the set of multiple sequences based on a product of an orthogonal matrix having a size corresponding to the number of one or more time periods and a cyclically shifted cell-specific sequence having a length corresponding to the number of one or more frequency tones, where the set of multiple sequences includes orthogonal sequences.

In some examples of the method, apparatuses, and non-transitory computer-readable medium described herein, the product includes a Kronecker product.

In some examples of the method, apparatuses, and non-transitory computer-readable medium described herein, the orthogonal matrix includes a discrete Fourier transform (DFT) matrix.

In some examples of the method, apparatuses, and non-transitory computer-readable medium described herein, the set of multiple sequences includes orthogonal sequences or nonorthogonal sequences.

A method for wireless communications at a receiving device is described. The method may include receiving a payload including a set of multiple bits using an interleaved sequence, where a length of the interleaved sequence is based on a number of one or more time periods for conveying the payload and a number of one or more frequency tones for conveying the payload, applying an interleaving function to de-interleave the interleaved sequence to generate a selected sequence, and decoding the payload based on the selected sequence.

An apparatus for wireless communications at a receiving device is described. The apparatus may include a processor, memory coupled with the processor, and instructions stored in the memory. The instructions may be executable by the processor to cause the apparatus to receive a payload including a set of multiple bits using an interleaved sequence, where a length of the interleaved sequence is based on a number of one or more time periods for conveying the payload and a number of one or more frequency tones for conveying the payload, apply an interleaving function to de-interleave the interleaved sequence to generate a selected sequence, and decode the payload based on the selected sequence.

Another apparatus for wireless communications at a receiving device is described. The apparatus may include means for receiving a payload including a set of multiple bits using an interleaved sequence, where a length of the interleaved sequence is based on a number of one or more time periods for conveying the payload and a number of one or more frequency tones for conveying the payload, means for applying an interleaving function to de-interleave the interleaved sequence to generate a selected sequence, and means for decoding the payload based on the selected sequence.

A non-transitory computer-readable medium storing code for wireless communications at a receiving device is described. The code may include instructions executable by a processor to receive a payload including a set of multiple bits using an interleaved sequence, where a length of the interleaved sequence is based on a number of one or more time periods for conveying the payload and a number of one or more frequency tones for conveying the payload, apply an interleaving function to de-interleave the interleaved sequence to generate a selected sequence, and decode the payload based on the selected sequence.

Some examples of the method, apparatuses, and non-transitory computer-readable medium described herein may further include operations, features, means, or instructions for identifying the interleaving function based on a table that maps element indices of the selected sequence to element indices of the interleaved sequence.

Some examples of the method, apparatuses, and non-transitory computer-readable medium described herein may further include operations, features, means, or instructions for identifying the interleaving function based on an equation defining the interleaving function.

Some examples of the method, apparatuses, and non-transitory computer-readable medium described herein may further include operations, features, means, or instructions for transmitting signaling that indicates the interleaving function.

Some examples of the method, apparatuses, and non-transitory computer-readable medium described herein may further include operations, features, means, or instructions for transmitting configuration signaling that configures interleaving for conveying the payload.

In some examples of the method, apparatuses, and non-transitory computer-readable medium described herein, generating, from the interleaved sequence, a virtual matrix having a number of rows equal to the number of one or more frequency tones for conveying the payload and having a number of columns equal to the number of one or more time periods for conveying the payload.

In some examples of the method, apparatuses, and non-transitory computer-readable medium described herein, applying the interleaving function to de-interleave the interleaved sequence to generate the selected sequence may include operations, features, means, or instructions for applying the interleaving function to elements of the interleaved sequence within columns of the virtual matrix, where a length of the interleaving function may be based on the number of one or more frequency tones for conveying the payload.

In some examples of the method, apparatuses, and non-transitory computer-readable medium described herein, applying the interleaving function to de-interleave the interleaved sequence to generate the selected sequence may include operations, features, means, or instructions for applying the interleaving function to elements of the interleaved sequence within rows of the virtual matrix, where a length of the interleaving function may be based on the number of one or more time periods for conveying the payload.

In some examples of the method, apparatuses, and non-transitory computer-readable medium described herein, applying the interleaving function to de-interleave the interleaved sequence to generate the selected sequence may include operations, features, means, or instructions for applying the interleaving function to elements of the interleaved sequence within rows of the virtual matrix and to elements of the interleaved sequence within columns of the virtual matrix, where a length of the interleaving function may be based on a product of the number of one or more time periods for conveying the payload and the number of one or more frequency tones for conveying the payload.

BRIEF DESCRIPTION OF THE DRAWINGS

FIG. 3A illustrates an example orthogonal matrix that supports sequence interleaving for conveying multi-bit payloads in accordance with aspects of the present disclosure.

FIG. 3B illustrates an example base sequence that supports sequence interleaving for conveying multi-bit payloads in accordance with aspects of the present disclosure.

FIG. 4 illustrates an example interleaving operation that supports sequence interleaving for conveying multi-bit payloads in accordance with aspects of the present disclosure.

DETAILED DESCRIPTION

Figure 1:
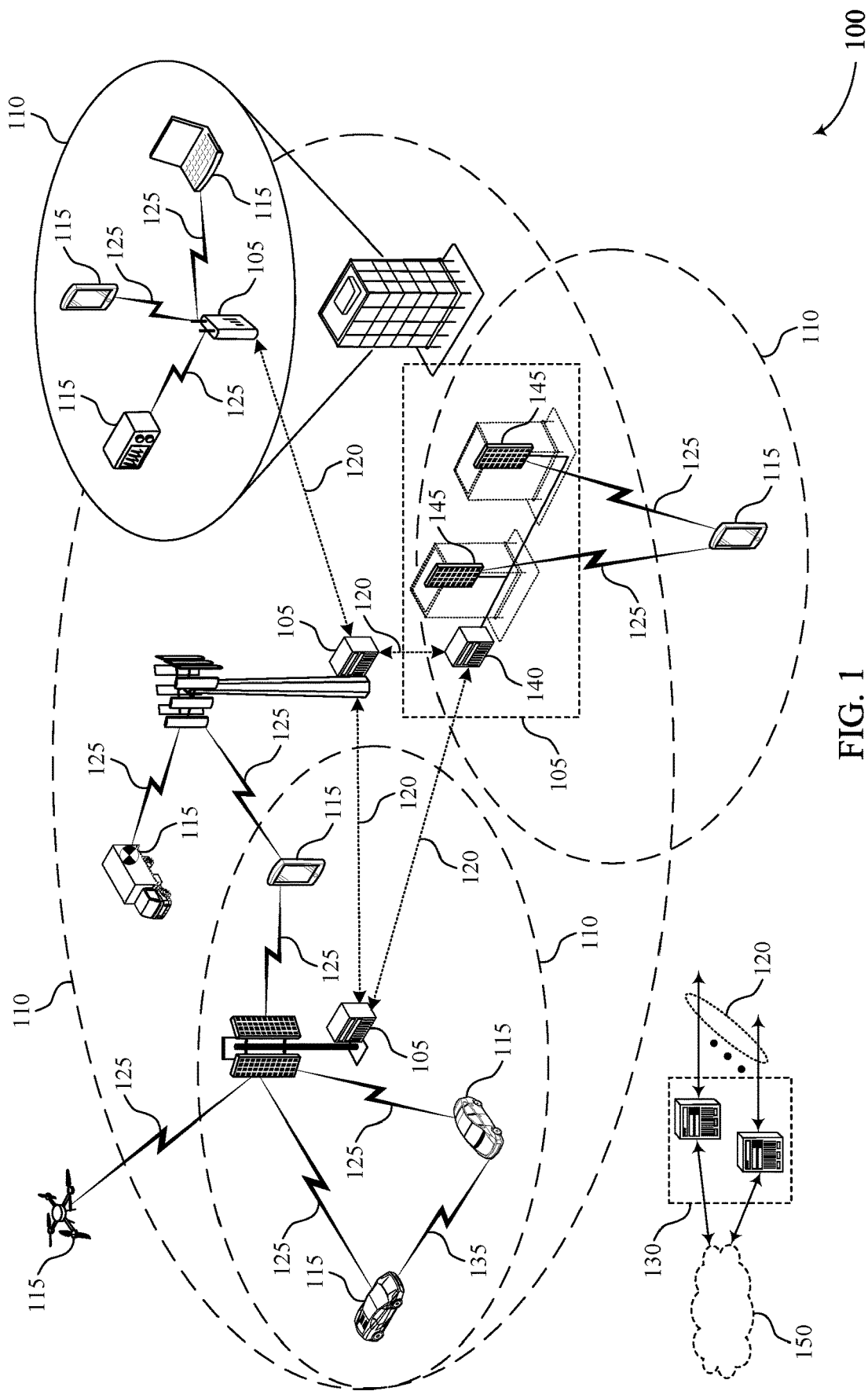
FIGS. 1 and 2 illustrate examples of wireless communications systems that support sequence interleaving for conveying multi-bit payloads in accordance with aspects of the present disclosure.

Wireless communications systems may include multiple communication devices such as UEs and base stations, which may provide wireless communication services to the UEs. For example, such base stations may be next-generation NodeBs or giga-NodeBs (either of which may be referred to as a gNB) that may support multiple radio access technologies including 4G systems, such as LTE systems, as well as 5G systems, which may be referred to as NR systems. Some wireless communications systems, such as 4G and 5G systems, may support sequence-based wireless communications between multiple communication devices, such as UEs and base stations. Examples of sequence-based wireless communications may use OFDM-based sequences, DFT-based sequences, and the like. Such sequences may have time-domain phase ramp properties, frequency-domain phase ramp properties, or both. Some wireless communications systems, such as 4G and 5G systems, may experience a Doppler effect, which may impact sequence-based wireless communications. Examples of a Doppler effect may include, for example, a high Doppler spread, a high delay spread, a high Doppler shift, a high delay shift, or a combination thereof. In some cases, the time-domain phase ramp properties or the frequency-domain phrase ramp properties of some sequences may result in errors at a receiver due to the corresponding time-domain or frequency-domain radio frequency propagation phenomena (e.g., Doppler shift or delay spreading). As demand for wireless communication efficiency increases, it may be desirable to provide improvements to sequence-based wireless communications to support higher reliability and lower latency, among other examples.

A base station or a UE, or both, may be configured to support sequence interleaving for sequence-based wireless communications, to decrease or mitigate a Doppler effect on the sequence-based wireless communications. For example, the base station or the UE, or both, may be configured to provide sequence interleaving for the sequence-based wireless communications to reduce or mitigate impact of a high Doppler spread, a high delay spread, a high Doppler shift, a high delay shift, or any combination of radio frequency propagation phenomena. The base station or the UE, or both, may select a sequence from a set of sequences (e.g., orthogonal sequences) for conveying a payload including a number of bits. A length of the selected sequence may depend on a number of symbol periods for conveying the payload and a number of frequency tones for conveying the payload. The base station or the UE, or both, may apply an interleaving function to the selected sequence to generate an interleaved sequence.

The base station or the UE, or both, may identify the interleaving function based on a table that maps element indices of the selected sequence to element indices of the interleaved sequence. In some other examples, the base station or the UE, or both, may identify the interleaving function based on an equation defining the interleaving function. The base station or the UE, or both, may thereby transmit the payload including the number of bits using the interleaved sequence. As a result, the base station or the UE, or both, may support higher reliability sequence-based wireless communications in wireless communications systems experiencing a high Doppler spread, a high delay spread, a high Doppler shift, a high delay shift, or a combination thereof.

Aspects of the subject matter described in this disclosure may be implemented to realize one or more of the following potential improvements, among others. The techniques employed by UEs may provide benefits and enhancements to the operation of the UEs. For example, operations performed by the UEs may provide improvements to sequence-based wireless communications. In some examples, configuring the UEs to support sequence interleaving of sequence-based wireless communications may support improvements to power consumption, spectral efficiency, and, in some examples, may promote enhanced efficiency for sequence-based wireless communications operations, among other benefits.

Aspects of the disclosure are initially described in the context of wireless communications systems. Aspects of the disclosure are further illustrated by and described with reference to apparatus diagrams, system diagrams, and flowcharts that relate to sequence interleaving for conveying multi-bit payloads.

FIG. 1 illustrates an example of a wireless communications system 100 that supports sequence interleaving for conveying multi-bit payloads in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links. One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples. The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples, (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may comprise one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs. The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $\Delta N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation. A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

A base station 105 or a UE 115, or both, may be configured to support sequence interleaving for sequence-based wireless communications, to combat a high Doppler spread, a high delay spread, a high Doppler shift, a high delay shift, or a combination thereof. For example, the base station 105 or the UE 115, or both, may select a sequence from a set of sequences (e.g., orthogonal sequences) for conveying a payload including a number of bits. For example, the base station 105 or the UE 115, or both, may be configured to transmit, and receive, a signal including a payload (e.g., a multi-bit payload) using an orthogonal sequence. In some examples, the base station 105 or the UE 115, or both, may generate or be configured with a set of orthogonal sequences, which may be equivalently referred to as a set of orthogonal codepoints. The orthogonal sequences may be orthogonal in a time domain, a frequency domain, or both. The number of orthogonal sequences in the set of orthogonal sequences may be based on a number of time periods, such as orthogonal frequency division multiplexing (OFDM) symbols, and a number of frequency tones, such as a number of subcarriers, that are allocated for transmitting the payload of the signal.

For example, the base station 105 or the UE 115, or both, may determine a resource allocation of N OFDM symbols and M frequency tones and may accordingly determine N×M orthogonal sequences. The base station 105 or the UE 115, or both may select an orthogonal sequence based on the size of the payload (e.g., the number of bits in the payload). For example, the base station 105 or the UE 115, or both, may identify that the payload includes a number of bits and may select a number of orthogonal sequences from the set of orthogonal sequences based on the number of bits. In some other examples, the base station 105 or the UE 115, or both, may construct a codebook including the orthogonal sequences. In the case that the codebook is constructed by the base station 105, the base station 105 may signal the constructed codebook to the UE 115.

The base station 105 or the UE 115, or both, may in some examples apply an interleaving function to the selected sequence to generate an interleaved sequence. The base station 105 or the UE 115, or both, may identify the interleaving function based on a table that maps element indices of the selected sequence to element indices of the interleaved sequence. In some other examples, the base station 105 or the UE 115, or both, may identify the interleaving function based on an equation defining the interleaving function. The base station 105 or the UE 115, or both, may transmit the payload including the number of bits using the interleaved sequence. As a result, the base station 105 or the UE 115, or both, may support higher reliability sequence-based wireless communications when the wireless communications system 100 experiences a high Doppler spread, a high delay spread, a high Doppler shift, a high delay shift, or a combination thereof.

Figure 2:
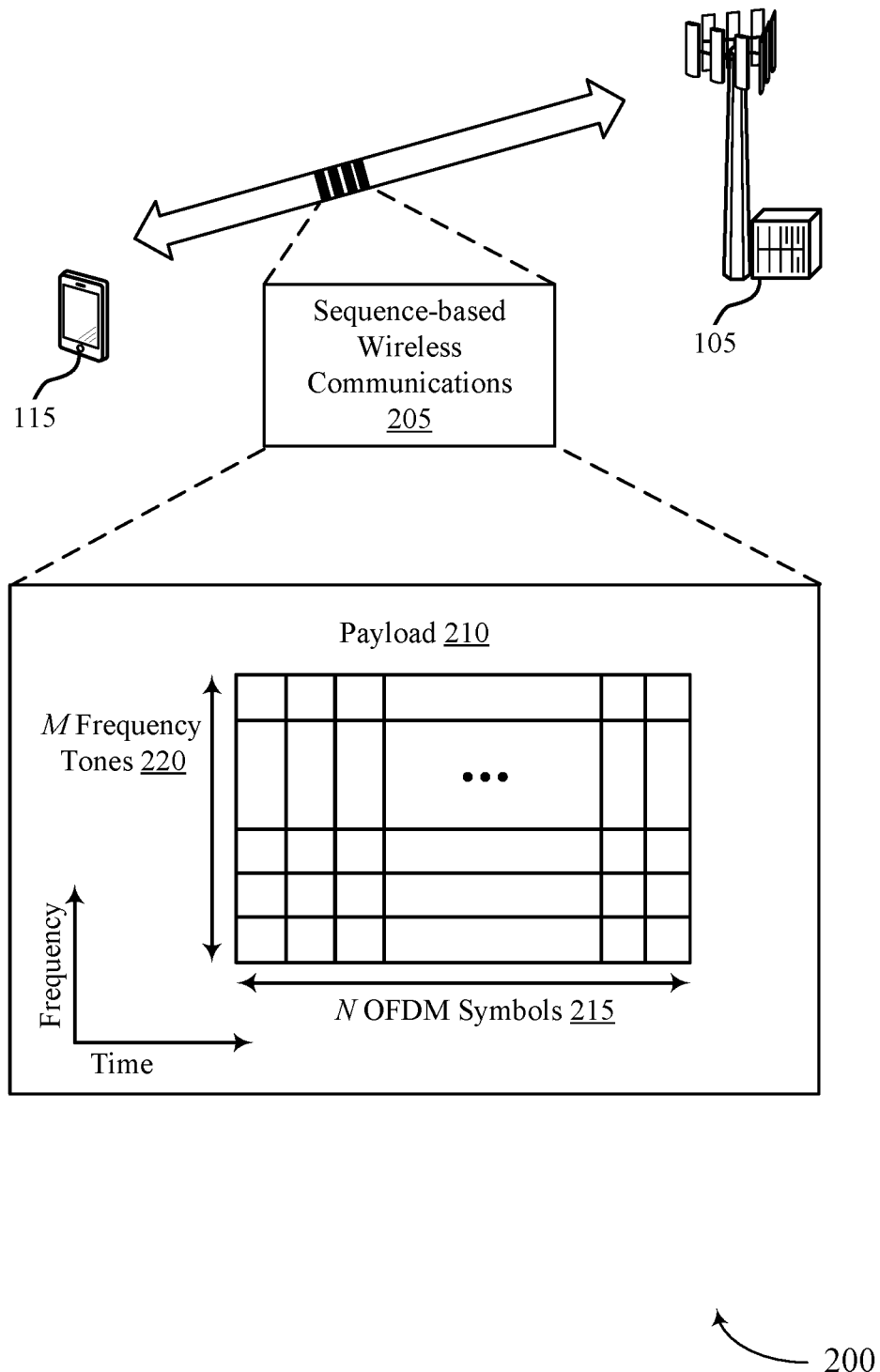

FIG. 2 illustrates an example of a wireless communications system 200 that supports sequence interleaving for conveying multi-bit payloads in accordance with aspects of the present disclosure. The wireless communications system 200 may support multiple radio access technologies including 4G systems such as LTE systems, LTE-A systems, or LTE-A Pro systems, and 5G systems which may be referred to as NR systems. In some examples, the wireless communications system 200 may implement aspects of the wireless communications system 100. For example, the wireless communications system 200 may support sequence-based wireless communications 205 between a base station 105 and a UE 115, which may be examples of corresponding devices described with reference to FIG. 1. The wireless communications system 200 may support improvements to power consumption and, in some examples, may promote higher reliability and lower latency for the sequence-based wireless communications 205, among other benefits.

The base station 105 and the UE 115 may be configured with multiple antennas, which may be used to employ techniques such as transmit diversity, receive diversity, multiple-input multiple-output communications, or beamforming, or any combination thereof. The antennas of the base station 105 and the UE 115 may be located within one or more antenna arrays or antenna panels, which may support multiple-input multiple-output operations or transmit or receive beamforming. For example, the antennas or antenna arrays associated with the base station 105 may be co-located at an antenna assembly, such as an antenna tower. The base station 105 may have an antenna array with a number of rows and columns of antenna ports that the base station 105 may use to support beamforming of directional communications with the UE 115. Likewise, the UE 115 may have one or more antenna arrays that may support various multiple-input multiple-output or beamforming operations. Additionally or alternatively, an antenna panel may support radio frequency beamforming for a signal transmitted via one or more antenna ports.

The base station 105 and the UE 115 may be configured to provide the sequence-based wireless communications 205 using multiple antennas. The sequence-based wireless communications 205 may use orthogonal sequences, nonorthogonal sequences, and the like. In some examples, the base station 105 and the UE 115 may be configured to use the sequence-based wireless communications 205 to communicate various types of communication (e.g., control information, data) between the base station 105 and the UE 115. In other words, the wireless communications system 200 may support the sequence-based wireless communications 205 to communicate various types of communication (e.g., control information, data) between a transmitter (e.g., of the base station 105 or the UE 115) and a receiver (e.g., of the base station 105 or the UE 115).

In the example of FIG. 2, the sequence-based wireless communications 205 may include a payload 210. The payload 210 may occupy a resource allocation of a resource grid. The resource grid may be based on a configuration by the base station 105, and implemented by the UE 115. For example, the resource grid may be applicable to implementations or instances when the UE 115 is configured to support sequence-based wireless communication with the base station 105, or vice-versa. The resource grid may include frequency and time resources that span over a frequency domain and a time domain. The frequency and time resources may include a number of subcarriers (e.g., a number of frequency tones) and a number of time periods (e.g., a number of symbols, such as OFDM symbols). The payload 210 may thereby occupy a resource allocation of N OFDM symbols 215 and M frequency tones 220 and the UE 115 may convey the payload 210 using a sequence based on the N OFDM symbols 215 and the M frequency tones 220.

As described herein, N may correspond to any number, but may sometimes be defined within the range of 1 to 14. Similarly, M may correspond to any number, but may sometimes be defined within the range of 1 to 12. In some cases, such as when N=14 and M=12, the resource allocation may be a resource block. The payload 210 may be an example of any signal including information (e.g., a number of bits). For example, the base station 105 may transmit a downlink signal including the payload 210 or the UE 115 may transmit an uplink signal including the payload 210. For example, the payload 210 may be an example of downlink control information (DCI) and, accordingly, the base station 105 may transmit the payload 210 in a resource allocation of a physical downlink control channel (PDCCH). Likewise, the payload 210 may be an example of an uplink control information (UCI) and, accordingly, the UE 115 may transmit the payload 210 in a resource allocation of a physical uplink control channel (PUCCH).

The base station 105 and the UE 115 may, in some cases, experience a radio frequency propagation phenomena such as a high Doppler spread or a high delay spread, or both in the wireless communications system 200. This Doppler effect or delay spread may affect sequence-based wireless communications between the base station 105 and the UE 115 due to a high-doppler or a large delay spread. In some cases, the base station 105 or the UE 115, or both, may use an orthogonal sequence or a nonorthogonal sequence to convey the payload 210. For example, the base station 105 or the UE 115, or both, may generate or be configured with a codebook of orthogonal sequences or nonorthogonal sequences, and the base station 105 or the UE 115, or both, may select an orthogonal sequence or a nonorthogonal sequence from the codebook to convey the payload 210. The orthogonal or nonorthogonal sequences may have certain properties that increase the negative effects of Doppler shift or delay spread. For example, sequences of a codebook may exhibit a time-domain phase ramp, a frequency-domain phase ramp, or both. In some circumstances, however, such use of orthogonal sequence or nonorthogonal sequences may fail to mitigate the effects of the Doppler effect (e.g., a high Doppler spread, a high delay spread, a high Doppler shift, a high delay shift, or a combination thereof) in the wireless communications system 200, which may decrease the likelihood for successful communications between the base station 105 or the UE 115.

The base station 105 and the UE 115 may thus be configured to support operations to manage or improve sequence-based wireless communications to combat a high Doppler spread, a high delay spread, a high Doppler shift, a high delay shift, or a combination thereof, in the wireless communications system 200. In addition, the base station 105 and the UE 115, in the wireless communications system 200, may support operations to preserve resources (for example, time and frequency resources of the wireless communications system 200), a battery life of the UE 115, among other examples. For example, the base station 105 or the UE 115, or both, may identify a number of bits (e.g., K bits) associated with the payload 210, and may generate a set of sequences based in part on the number of bits.

For example, the base station 105 or the UE 115, or both, may communicate via a resource allocation of a communication channel and the base station 105 or the UE 115, or both, may generate a number of orthogonal sequences (or nonorthogonal sequences) based on the resource allocation. For instance, the base station 105 may allocate N OFDM symbols 215 and M frequency tones 220 for transmission of the payload 210 and, accordingly, the base station or the UE 115, or both, may generate a number of orthogonal sequences equal to N×M. In some examples, each orthogonal sequence of the set of orthogonal sequences may have a length equal to the size of the resource allocation (e.g., the number of resource elements in the resource allocation, or N×M), such that each orthogonal sequence (or nonorthogonal sequence) may convey the payload 210 across the resource allocation. The base station 105 or the UE 115, or both, may generate a set of N×M orthogonal sequences and each orthogonal sequence may be associated with a length of N*M. The generation of orthogonal sequences is described in more detail with reference to FIGS. 3A and 3B.

The base station 105 or the UE 115, or both, may determine a set of orthogonal sequences (or nonorthogonal sequences) based on the payload 210. For example, the base station 105 or the UE 115, or both, may determine a size of the payload 210 (e.g., a number of bits included in the payload 210) and may determine the set of orthogonal sequences based on the size of the payload 210. For instance, the payload 210 may include a number of bits equal to K and, accordingly, the number of orthogonal sequences within the determined set may be based on the value of K. In some examples, the base station 105 or the UE 115, or both, may select a number of orthogonal sequences equal to $2^K$ based on identifying that the payload 210 includes K bits. In some examples, the base station 105 or the UE 115, or both, may select $2^K$ orthogonal sequences because $2^K$ orthogonal sequences may provide one sequence for each possible value (i.e., permutation) of K bits.

The UE 115 may identify a set of orthogonal sequences (e.g., $2^K$ orthogonal sequences) from which the UE 115 may select an orthogonal sequence to convey the payload 210. In the case that the base station 105 generates the set of orthogonal sequences the base station 105 may signal an indication of the set of orthogonal sequences to the UE 115, and the UE 115 may construct a codebook including the indicated set of orthogonal sequences. Alternatively, in the case that the UE 115, or both the base station 105 and the UE 115 generates the set of orthogonal sequences the UE 115 may construct a codebook including the set of orthogonal sequences without additional signaling from the base station 105. In some examples, the UE 115 may construct the codebook such that each orthogonal sequence of the set of orthogonal sequences in the codebook is associated with an index in the codebook. The base station 105 or the UE 115, or both, may select an orthogonal sequence from the set of orthogonal sequences (e.g., from the constructed codebook) to convey the payload 210 based on the bits in the payload 210.

To manage or improve sequence-based wireless communications when combating a high Doppler spread, a high delay spread, a high Doppler shift, a high delay shift, or a combination thereof, the base station 105 or the UE 115, or both, may apply an interleaving function to the generated orthogonal sequence (or the selected orthogonal sequence or nonorthogonal sequence). In some examples, the base station 105 or the UE 115, or both may use a nonlinear interleaving function. The generated orthogonal sequence (or the selected orthogonal sequence) may be represented as $a=[a_0, \ldots, a_{K-1}]$, where a corresponds to a value of a bit and K is equal to the number of bits in the payload 210. The base station 105 or the UE 115, or both, may apply an interleaving function to the generated orthogonal sequence (or the selected orthogonal sequence) $a=[a_0, \ldots, a_{K-1}]$ to generate an interleaved orthogonal sequence represented as $b=[b_0, \ldots, b_{K-1}]$, where b corresponds to a value of a bit and K is equal to the number of bits in the payload 210.

The base station 105 or the UE 115, or both may identify an interleaving function based in part on a table or an equation defining the interleaving function. The interleaving function may, in some examples, be a second order or a higher order polynomial equation. For example, the interleaving function may be defined by Equation (1):

$$b_i = a_{\pi(i)} \quad (1)$$

where $\pi(i)$ is a permutation or interleaving function $\pi(\bullet)$: $\{0, \ldots, K-1\} \rightarrow \{0, \ldots, K-1\}$. As such, the base station 105 or the UE 115, or both, may generate the interleaved sequence $b=[b_0, \ldots, b_{K-1}]$ in accordance with Equation (1). The interleaving function may, in some examples, be a quadratic equation of length n as defined by Equation (2):

$$\Pi(i) = (a_0 + a_1 i + a_2 i^2) \bmod n \quad (2)$$

where $a_0, a_1, a_2$ are selected such that $\Pi(\bullet)$ forms a permutation function. Alternatively, the interleaving function of length n may be defined by a table, such as for example Table 1, below. Each element indices of the generated sequence may map to element indices of an interleaved sequence in Table 1. Alternatively, the UE 115 may receive signaling that indicates the interleaving function for conveying the payload 210. For example, the UE 115 may receive, from the base station 105, configuration signaling that configures interleaving for conveying the payload 210.

TABLE 1

| Interleaving Sequence of Length 12 | | | |
|---|---|---|---|
| i | Π(i) | i | Π(i) |
| 0 | 0 | 6 | 2 |
| 1 | 9 | 7 | 6 |
| 2 | 4 | 8 | 5 |
| 3 | 3 | 9 | 10 |
| 4 | 1 | 10 | 7 |
| 5 | 8 | 11 | 11 |

The configuration signaling may include a configuration message. The configuration message may be an RRC message. The base station 105 may enable and disable an interleaving for conveying the payload 210 via the RRC message. For example, if the UE 115 receives the configuration message (e.g., an RRC message) including an indication that interleaving is enabled, the UE 115 may perform the interleaving for conveying the payload 210 (e.g., enable an interleaver of the UE 115). Otherwise, the UE 115 may not perform (e.g., refrain from performing) the interleaving for conveying the payload 210 (e.g., disable an interleaver of the UE 115). In some examples, the configuration message (e.g., an RRC message) may include an indication that interleaving is disabled, and thereby the UE 115 may not perform (e.g., refrain from performing) the interleaving for conveying the payload 210 (e.g., disable an interleaver of the UE 115). In some other examples, the UE 115 may not perform (e.g., refrain from performing) the interleaving for conveying the payload 210 (e.g., disable an interleaver of the UE 115) based on an absence of the configuration message. That is, the base station 105 may not transmit the configuration signaling to the UE 115, and based on not receiving the configuration signaling the UE 115 may determine to disable an interleaver of the UE 115.

In some examples, base station 105 or the UE 115, or both, may generate, based on the generated orthogonal sequence, or a generated nonorthogonal sequence, $a=[a_0, \ldots, a_{K-1}]$, a virtual matrix having a number of rows equal to a number of frequency tones for conveying the payload 210 and having a number of columns equal to a number of symbols for conveying the payload 210. The base station 105 or the UE 115, or both, may apply an interleaving function to elements or values of the generated orthogonal sequence $a=[a_0, \ldots, a_{K-1}]$ within columns of the virtual matrix, where a length of the interleaving function is based on the number of frequency tones for conveying the payload 210.

In some examples, the base station 105 or the UE 115, or both, may apply an interleaving function to values of the generated orthogonal sequence $a=[a_0, \ldots, a_{K-1}]$ within rows of the virtual matrix. In other examples, the base station 105 or the UE 115, or both, may apply an interleaving function to values of the generated orthogonal sequence $a=[a_0, \ldots, a_{K-1}]$ within rows of the virtual matrix and to values of the generated orthogonal sequence $a=[a_0, \ldots, a_{K-1}]$ within columns of the virtual matrix. The interleaving of the generated orthogonal sequence is described in more detail with reference to FIG. 4.

The base station 105 or the UE 115, or both, may apply the permutation or interleaving to a frequency domain (e.g., over subcarriers in a frequency domain). In some other examples, the base station 105 or the UE 115, or both, may apply the permutation or interleaving to a time domain (e.g., over OFDM symbols in a time domain). In other examples, the base station 105 or the UE 115, or both, may apply the permutation or interleaving to both the frequency domain (e.g., over subcarriers in the frequency domain) and the time domain (e.g., over OFDM symbols in the time domain).

The base station 105 and the UE 115 may thus experience improvements to sequence-based wireless communications by supporting interleaving and permutation of sequences (e.g., orthogonal sequences). In some examples, configuring the base station 105 and the UE 115 to support uplink sequence-based wireless communications may support improvements to spectral efficiency, and, in some examples, may promote higher reliability and lower latency for sequence-based wireless communications operations, among other benefits.

FIG. 3A illustrates an example orthogonal matrix 300-a that supports sequence interleaving for conveying multi-bit payloads in accordance with aspects of the present disclosure. FIG. 3B illustrates an example base sequence 300-b that supports sequence interleaving for conveying multi-bit payloads in accordance with aspects of the present disclosure. In some examples, the orthogonal matrix 300-a and the base sequence 300-b may be implemented to realize aspects of wireless communications system 100 and the wireless communications system 200. For example, a UE 115 or a base station 105, or both, may use the orthogonal matrix 300-a and the base sequence 300-b to generate a set of orthogonal sequences from which the UE 115 may select an orthogonal sequence to convey a payload to the base station 105. The base station 105 and the UE 115 may be examples of corresponding devices as described herein.

The orthogonal matrix 300-a, which may be referred to as W, may be an orthogonal, square matrix of size N (i.e., an N×N matrix). In some implementations, N may be equal to the number of symbols of a resource allocation associated with transmission of the payload, as described in more detail with reference to FIG. 2. Further, in some specific examples, the orthogonal matrix 300-a may be a discrete Fourier transform (DFT) matrix and, as such, may be equivalently referred to as a DFT matrix. Accordingly, a row or a column of the orthogonal matrix 300-a (e.g., a vector) may be referred to as either $\vec{w}(n)$ or $\overline{DFT}(n)$, where n is an index of the row or the column of the orthogonal matrix 300-a (e.g., the $n^{th}$ row or column). Although FIG. 3A illustrates n=1, n may be equal to any number n=0, 1, 2, . . . , N−1. A row of the orthogonal matrix 300-a may be defined by Equation (3), shown below.

$$\overline{DFT}(n) = [\omega^{0n}, \omega^{1n}, \omega^{2n}, \ldots, \omega^{in}, \ldots, \omega^{(N-1)n}] \quad (3)$$

The corresponding column of the orthogonal matrix 300-a may be equal to $\overline{DFT}(n)^T$. In Equation (3), ω may be defined as either $\omega = e^{-j2\pi/N}$ or $\omega = e^{j2\pi/N}$. Each column of the vector $\overline{DFT}(n)$ (or each row of the vector $\overline{DFT}(n)^T$) may correspond to an OFDM symbol index i, where i=0 in the first column (i.e., the left-most column) of the orthogonal matrix 300-a and increments by one to i=N−1 in the last column (i.e., the right-most column) of the orthogonal matrix 300-a. In some cases, an OFDM symbol index i may correspond to an OFDM symbol of the resource allocation that the UE 115 may use to transmit the payload. In some cases, phase ramp of a row or a column of the orthogonal matrix 300-a may be defined as i*n, where i is the OFDM symbol index and n may describe the slope of the phase change. As such, a column or a row of the orthogonal matrix 300-a may include entries for each OFDM symbol of the resource allocation in one frequency tone.

The base sequence 300-b, which may be equivalently referred to as a base sequence $\vec{S}(m)$, may be a cyclically shifted frequency-domain base sequence. In other words, the base sequence 300-b may be a frequency-domain base sequence S associated with a cyclic shift in the time-domain. As such, the base sequence S may be based on a cyclic shift index m, where m=0, 1, 2, . . . , M−1. In some aspects, M may be equal to the number of frequency tones of a resource allocation associated with the transmission of the payload, as described in more detail with reference to FIG. 2. Equivalently, the base sequence S may be associated with a phase ramp vector in the frequency domain, such as $e^{-j2\pi lm/M}$ or $e^{j2\pi lm/M}$, and the phase ramp vector and the base sequence S may be multiplied together to determine the base sequence $\vec{S}(m)$, as shown by base sequence 300-b.

For example, the base station 105 or the UE 115, or both, may take a DFT or a fast Fourier transform (FFT) of the base sequence S in the frequency-domain to convert the base sequence S to the time-domain, where in the time-domain representation of the base sequence S, which may be referred to as $\tilde{S}$, has a length M. The base station 105 or the UE 115, or both, may apply a cyclic shift index m to $\tilde{S}$ to shift $\tilde{S}$ by index m, which may effectively move the entries of $\tilde{S}$ forward or backward by m in a cyclic fashion. The time-domain cyclic shift may correspond to the frequency-domain phase ramp vector $e^{-j2\pi lm/M}$ or $e^{j2\pi lm/M}$. The index m of the phase ramp may correspond to a slope of the phase ramp (e.g., the phase ramp may be defined as m/M) and the index l may correspond to a tone index of the resource allocation. As shown in base sequence 300-b, S(0), S(1), S(2), . . . , S(l), . . . , S(M−1) may correspond to entries of the base sequence S for each frequency tone l=0, 1, 2, . . . , M−1. Accordingly, the base sequence 300-b may include entries for each frequency tone of the resource allocation in one OFDM symbol. In some cases, the base sequence 300-b may be a cell-specific base sequence, such that each UE 115 within a cell of the base station 105 (e.g., within a geographic coverage area of the base station 105) may use the same base sequence 300-b. Further, in some cases, the base sequence 300-b may have a low peak-to-average power ratio (PAPR) property and may be referred to as a low PAPR sequence.

As illustrated in FIG. 3B, the base sequence 300-b may be a vector of size M×1. Additionally, there may be a number of base sequences 300-b equal to the number of cyclic shift indices associated with the base sequence 300-b. For instance, there may be M base sequences 300-b (i.e., one base sequence $\vec{S}(m)$ for each of m=0, 1, 2, . . . , M−1). Further, each row of the base sequence 300-b may correspond to a frequency tone index l, where l=0 in the first row (i.e., the bottom row) and increments by one to l=M−1 in the last column (i.e., the top row). As such, each frequency tone index l may correspond to a frequency tone of the resource allocation associated with the transmission of the payload. Accordingly, a number of base sequences 300-b (e.g., a number equal to M) may be considered, and the number of base sequences 300-b may be visualized as a matrix of base sequences $\vec{s}(m)$ of dimensions M×M (e.g., M cyclic shifts×M frequency tones).

As described herein, the base station 105 or the UE 115, or both, may generate a set of orthogonal sequences. In some examples, the base station 105 or the UE 115, or both, may generate a number of orthogonal sequences based on a product, such as a Kronecker product, of the orthogonal matrix 300-a and each of the number of base sequences 300-b. The Kronecker product of the orthogonal matrix 300-a and each of the number of base sequences 300-b may involve determining the Kronecker product of each row or column n of the orthogonal matrix 300-a and each cyclic shift index m of the base sequence 300-b, and repeating the operation for all permutations of n and m, where n=0, 1, ..., N−1 and m=0, 1, ..., M−1.

As such, the number of orthogonal sequences in the set may be equal to the product of the dimensions of the orthogonal matrix 300-a and a matrix representation of the base sequences 300-b. For instance, the orthogonal matrix 300-a may be a matrix of size N×N and the base sequences 300-b may be represented by a matrix of size M×M and, therefore, the Kronecker product between the two may result in an (N×M)×(N×M) matrix. In other words, the base station 105 or the UE 115, or both, may generate a number of orthogonal sequences equal to N×M and each orthogonal sequence may have a length of N×M. As such, each orthogonal sequence may have a length equal to the number of resource elements (e.g., the number of OFDM symbol× frequency tone resource elements) included in the resource grid that is allocated to the UE 115 for transmission of the payload.

As such, the base station 105 or the UE 115, or both, may generate a set of orthogonal sequences that may convey a payload across resources allocated for a payload based on a product of an orthogonal matrix having a size corresponding to the number of time periods and a cyclically shifted cell-specific sequence having a length corresponding to the number of frequency tones. The base station 105 or the UE 115, or both, may repeat a Kronecker product for each unique pair of row or column index n of the orthogonal matrix 300-a and each cyclic shift index m of the base sequence 300-b (i.e., each unique (n, m) pair) to generate N*M orthogonal sequences, where each of the N*M orthogonal sequences may convey the payload across each resource element in the resource grid defined by N OFDM symbols and M frequency tones. In some implementations, the base station 105 or the UE 115, or both, may construct a codebook of a set of the N*M orthogonal sequences based on the number of bits in the payload.

However, sequences generated using the example techniques described in FIG. 3A and FIG. 3B may be susceptible to high Doppler or large delay spread. For example, the different columns of the orthogonal matrix 300-a may correspond to a time-domain phase ramp with respect to each other column. Similarly, the different entries of the base sequence 300-b may correspond to a frequency-domain phase ramp with respect to each other ramp. The phase ramp properties of these sequences (either in the time domain or frequency domain), and the sequences resulting from their multiplication, may increase the likelihood of reception errors at a receiver that is experiencing certain radio frequency propagation phenomena (e.g., high Doppler and/or large delay spread), because these time-domain or frequency-domain propagation phenomena may appear to a receiver as representing a different sequence from the codebook than the sequence used by the transmitter to convey the payload. As such, in accordance with aspects of the present disclosure, a sequence selected for conveying a payload (e.g., an orthogonal sequence generated from the process described in FIG. 3A and FIG. 3B) may be interleaved (e.g., using a non-linear interleaving function) to mitigate the effects of Doppler or delay spread by breaking the linear phase ramp properties of the sequences.

FIG. 4 illustrates an example interleaving operation 400 that supports sequence interleaving for conveying multi-bit payloads in accordance with aspects of the present disclosure. In some examples, a base station 105 or a UE 115, or both, which may be examples of corresponding devices as described herein, may perform the interleaving operation 400 to manage or improve sequence-based wireless communications when combating a high Doppler spread, a high delay spread, a high Doppler shift, a high delay shift, or a combination thereof. For example, the base station 105 or the UE 115, or both, may generate a sequence (e.g., an orthogonal sequence) 405 (e.g., a=[$a_0$, ..., $a_{K-1}$], where a corresponds to a value of a bit and K is equal to a number of bits in a payload).

In some examples, the base station 105 or the UE 115, or both, may generate, based on the generated sequence 405 a=[$a_0$, ..., $a_{K-1}$], a virtual matrix 410 having a number of rows equal to a number of frequency tones for conveying the payload and having a number of columns equal to a number of symbols for conveying the payload. In some examples, the base station 105 or the UE 115, or both, may apply an interleaving function to elements or values of the generated sequence 405 a=[$a_0$, ..., $a_{K-1}$] within rows of the virtual matrix, as illustrated with row interleaving 415. For example, the base station 105 or the UE 115, or both, may permute rows of the virtual matrix. In some examples, within each row of the virtual matrix, an order of the elements ($a_0$, ..., $a_{K-1}$) is unchanged. Thus, the base station 105 or the UE 115, or both, may interleave subcarriers and a same interleaver is applied to all symbol periods (e.g., OFDM symbols). In such examples, a length of the interleaving function is based on the number of time periods for conveying the payload (or otherwise based on the number of columns in the virtual matrix 410).

In some examples, the base station 105 or the UE 115, or both, may apply an interleaving function to elements or values of the generated sequence 405 a=[$a_0$, ..., $a_{K-1}$] within columns of the virtual matrix 405, as illustrated with column interleaving 420. For example, the base station 105 or the UE 115, or both, may permute columns of the virtual matrix. In some examples, within each column of the virtual matrix, an order of the elements ($a_0$, ..., $a_{K-1}$) is unchanged. Thus, the base station 105 or the UE 115, or both, may apply a same interleaver to all symbol periods (e.g., OFDM symbols) to each subcarrier. In such examples, a length of the interleaving function is based on the number of frequency tones for conveying the payload (or otherwise based on the number of rows in the virtual matrix 410).

In other examples, the base station 105 or the UE 115, or both, may apply an interleaving function to elements or values of the generated sequence 405 a=[$a_0$, ..., $a_{K-1}$] within rows of the virtual matrix and to values of the generated sequence 405 a=[$a_0$, ..., $a_{K-1}$] within columns of the virtual matrix, as illustrated with row and column interleaving 425. In some examples, within each column and each row of the virtual matrix, an order of the elements ($a_0$, ..., $a_{K-1}$) is unchanged. The interleaving function illustrated with respect to interleaving operation 400 is an example, and any other interleaving function may be used, such as a random interleaving function, an interleaving function defined by a formula, or interleaving function defined by a table, as described with reference to FIG. 3.

The base station or the UE 115, or both, may thereby experience improvements to sequence-based wireless communications by supporting interleaving or permutation of sequences. In some examples, configuring the base station 105 or the UE 115, or both, to support sequence-based wireless communications may support improvements to sequence-based wireless communications, for example, such as promote higher reliability and lower latency sequence-based wireless communications, among other benefits.

Figure 5:
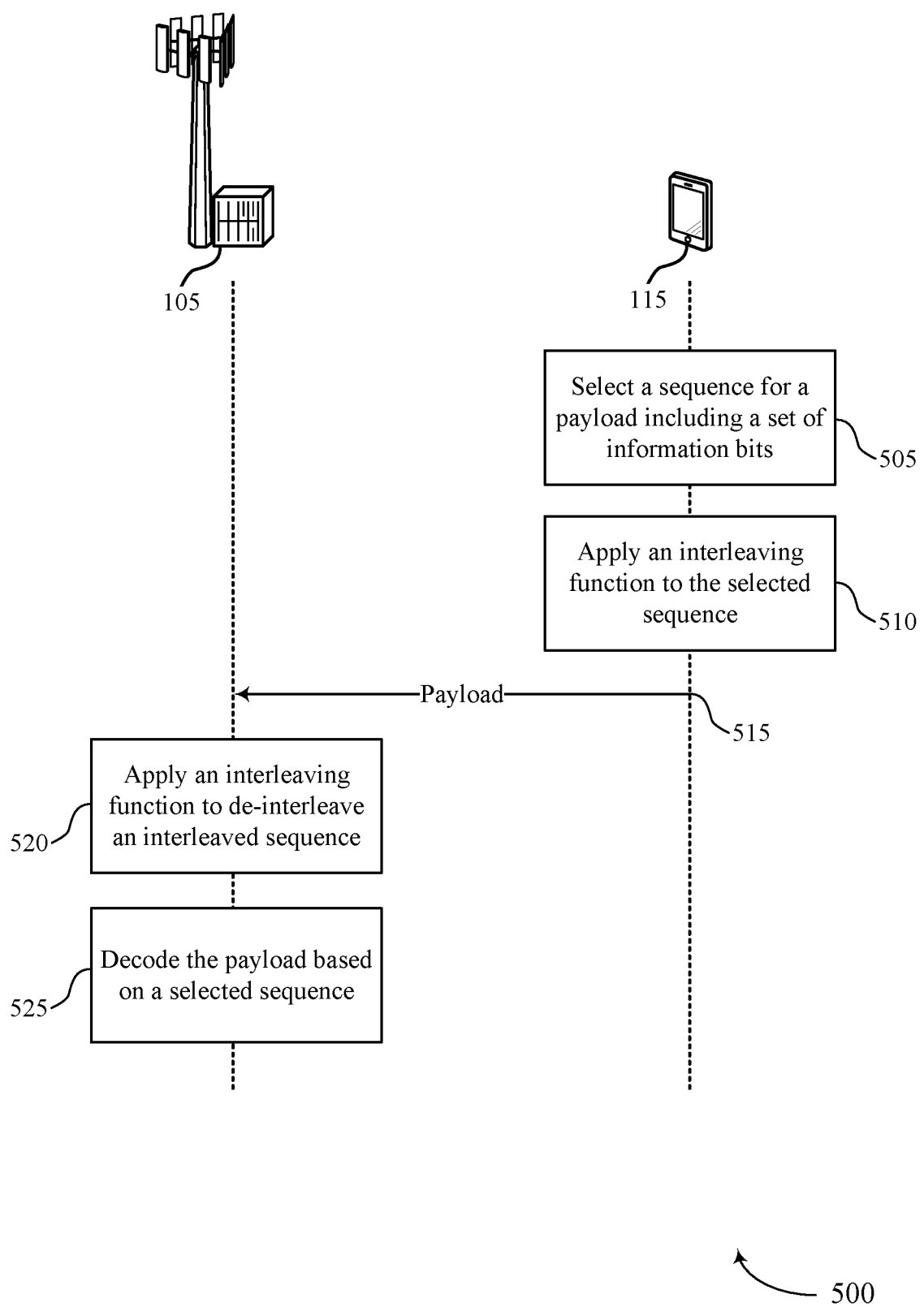
FIG. 5 illustrates an example of a process flow that supports sequence interleaving for conveying multi-bit payloads in accordance with aspects of the present disclosure.

FIG. 5 illustrates an example of a process flow 500 in accordance with various aspects of the present disclosure. The process flow 500 may implement aspects of the wireless communications systems 100 and 200, as described with reference to FIGS. 1 and 2. For example, the process flow 500 may be based on a configuration provided by a base station 105, and implemented by a UE 115, for reduced power consumption, and may promote high reliability and low latency sequence-based wireless communications, among other benefits. In the following description of the process flow 500, the operations between the base station 105 and the UE 115 may be transmitted in a different order than the example order shown, or the operations performed by the base station 105 and the UE 115 may be performed in different orders or at different times. Some operations may also be omitted from the process flow 500, and other operations may be added to the process flow 500.

At 505, the UE 115 (e.g., a transmitting device) may select a sequence for conveying a payload including a set of information bits. For example, the UE 115 may select a sequence from a set of orthogonal sequences or nonorthogonal sequences for conveying the payload including the set of information bits. A length of the selected sequence may depend on a number of time periods for conveying the payload and a number of frequency tones for conveying the payload. In some examples, the UE 115 may generate the set of orthogonal sequences based on a product of an orthogonal matrix having a size corresponding to the number of time periods and a cyclically shifted cell-specific sequence having a length corresponding to the number of frequency tones. The product may be Kronecker product, and the orthogonal matrix may be a DFT matrix. Similarly, the base station 105 may perform same or similar operations when transmitting a payload to the UE 115.

At 510, the UE 115 may apply an interleaving function to the selected sequence. For example, the UE 115 may apply the interleaving function to the selected sequence to generate an interleaved sequence. In some examples, the UE 115 may identify the interleaving function based on a table that maps element indices of the selected sequence to element indices of the interleaved sequence. In some other examples, the UE 115 may identify the interleaving function based on an equation defining the interleaving function. In other examples, the UE 115 may receive signaling that indicates the interleaving function or that configures interleaving for conveying the payload, or both. The signaling may be RRC signaling, medium access control-control element (MAC-CE) signaling, or DCI signaling, etc. The UE 115 may map the interleaved sequence to physical resources corresponding to the number of time periods for conveying the payload and the number of frequency tones for conveying the payload, for example, as described in FIG. 3. Similarly, the base station 105 may perform same or similar operations when transmitting a payload to the UE 115.

The UE 115 may generate, from the selected sequence, a virtual matrix having a number of rows equal to the number of frequency tones for conveying the payload and having a number of columns equal to the number of time periods for conveying the payload. In some examples, the UE 115 may apply the interleaving function to elements or values of the selected sequence within columns of the virtual matrix. A length of the interleaving function may be based on the number of frequency tones for conveying the payload. In some other examples, the UE 115 may apply the interleaving function to elements or values of the selected sequence within rows of the virtual matrix. A length of the interleaving function may be based on the number of time periods for conveying the payload. In other examples, the UE 115 may apply the interleaving function to elements or values of the selected sequence within rows of the virtual matrix and to elements or values of the selected sequence within columns of the virtual matrix. A length of the interleaving function may depend on a product of the number of time periods for conveying the payload and the number of frequency tones for conveying the payload. Similarly, the base station 105 may perform same or similar operations when transmitting a payload to the UE 115. At 515, the UE 115 may transmit the payload to the base station 105 using the interleaved sequence.

At 520, the base station 105 (e.g., a receiving device) may apply an interleaving function to de-interleave an interleaved sequence. For example, the base station 105 may receive the payload including the set of information bits using an interleaved sequence and apply the interleaving function to de-interleave the interleaved sequence to generate a selected sequence (e.g., the sequence used by the UE 115 to convey the payload). A length of the interleaved sequence may depend on a number of time periods for conveying the payload and a number of frequency tones for conveying the payload. In some examples, the base station 105 may identify the interleaving function based on a table that maps element indices of the selected sequence to element indices of the interleaved sequence. In some other examples, the base station 105 may identify the interleaving function based on an equation defining the interleaving function. At 525, the base station 105 may decode the payload based on the selected sequence determined based on the de-interleaving process.

Figure 6:
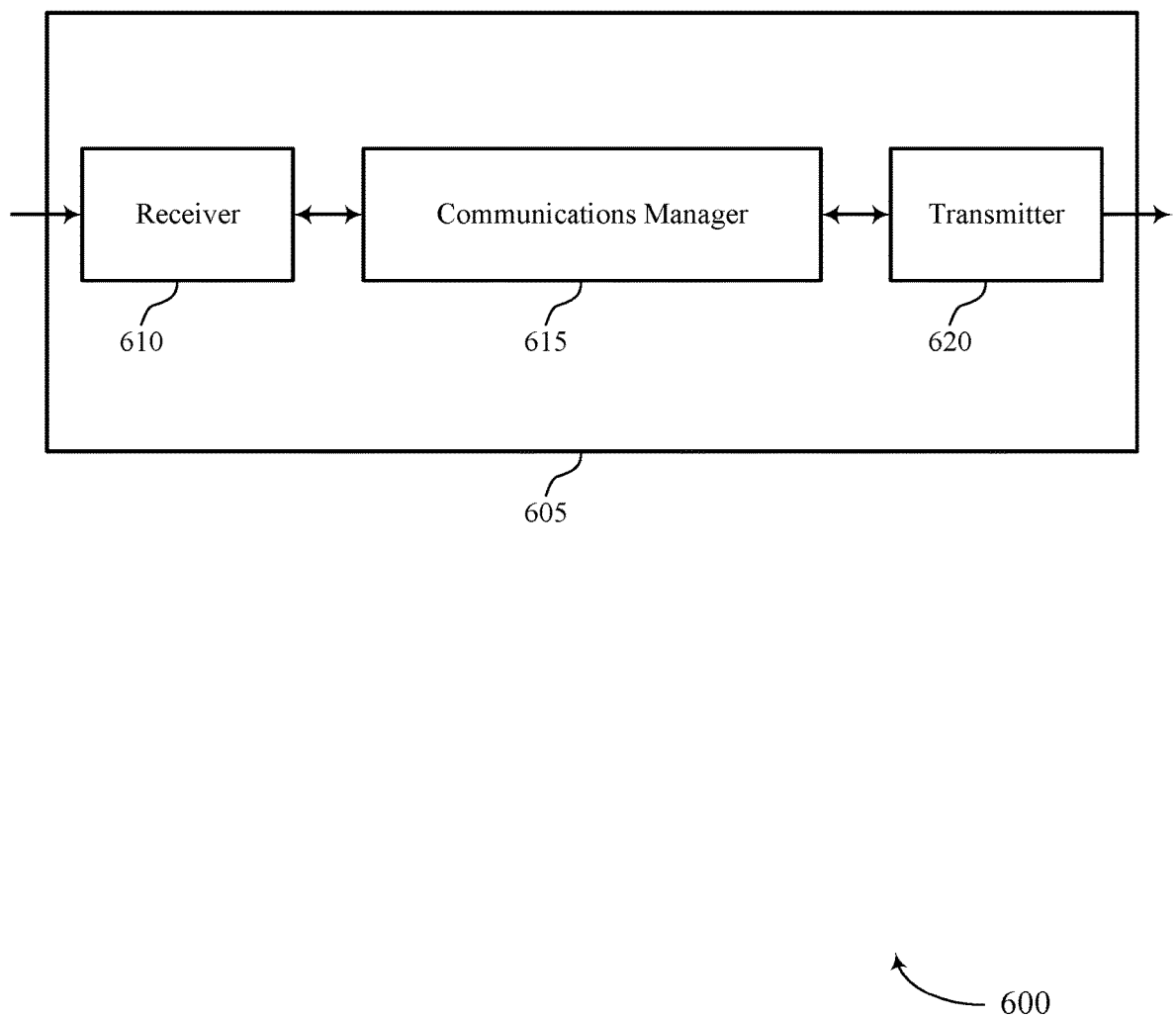
FIGS. 6 and 7 show block diagrams of devices that support sequence interleaving for conveying multi-bit payloads in accordance with aspects of the present disclosure.

FIG. 6 shows a block diagram 600 of a device 605 that supports sequence interleaving for conveying multi-bit payloads in accordance with aspects of the present disclosure. The device 605 may be an example of aspects of a device as described herein. The device 605 may include a receiver 610, a communications manager 615, and a transmitter 620. The device 605 may also include a processor. Each of these components may be in communication with one another (e.g., via one or more buses).

The receiver 610 may receive information such as packets, user data, or control information associated with various information channels (e.g., control channels, data channels, and information related to sequence interleaving for conveying multi-bit payloads, etc.). Information may be passed on to other components of the device 605. The receiver 610 may be an example of aspects of the transceiver 920 described with reference to FIG. 10. The receiver 610 may utilize a single antenna or a set of antennas.

The communications manager 615 may select a sequence from a set of sequences for conveying a payload including a set of bits, where a length of the selected sequence is based on a number of time periods for conveying the payload and a number of frequency tones for conveying the payload, apply an interleaving function to the selected sequence to generate an interleaved sequence, and transmit the payload including the set of bits using the interleaved sequence.

The communications manager 615 may also receive a payload including a set of bits using an interleaved sequence, where a length of the interleaved sequence is based on a number of time periods for conveying the payload and a number of frequency tones for conveying the payload, apply an interleaving function to de-interleave the interleaved sequence to generate a selected sequence, and decode the payload based on the selected sequence. The communications manager 615 may be an example of aspects of the communications manager 1010 described herein.

The communications manager 615, or its sub-components, may be implemented in hardware, code (e.g., software or firmware) executed by a processor, or any combination thereof. If implemented in code executed by a processor, the functions of the communications manager 615, or its sub-components may be executed by a general-purpose processor, a DSP, an application-specific integrated circuit (ASIC), an FPGA or other programmable logic device, discrete gate or transistor logic, discrete hardware components, or any combination thereof designed to perform the functions described in the present disclosure.

The communications manager 615, or its sub-components, may be physically located at various positions, including being distributed such that portions of functions are implemented at different physical locations by one or more physical components. In some examples, the communications manager 615, or its sub-components, may be a separate and distinct component in accordance with various aspects of the present disclosure. In some examples, the communications manager 615, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 620 may transmit signals generated by other components of the device 605. In some examples, the transmitter 620 may be collocated with a receiver 610 in a transceiver module. For example, the transmitter 620 may be an example of aspects of the transceiver 920 described with reference to FIG. 10. The transmitter 620 may utilize a single antenna or a set of antennas.

Figure 7:
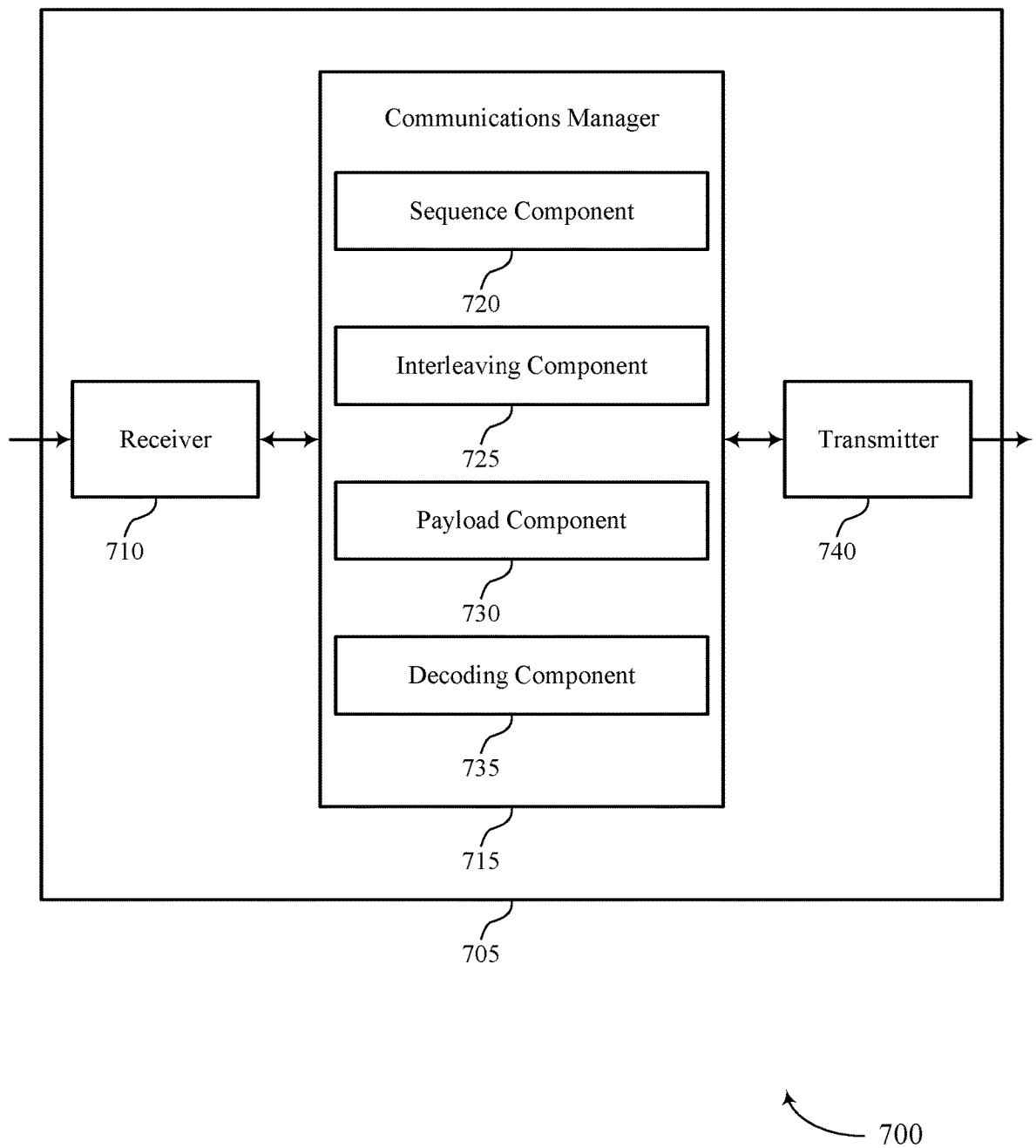

FIG. 7 shows a block diagram 700 of a device 705 that supports sequence interleaving for conveying multi-bit payloads in accordance with aspects of the present disclosure. The device 705 may be an example of aspects of a device 605 or a device 115 as described herein. The device 705 may include a receiver 710, a communications manager 715, and a transmitter 740. The device 705 may also include a processor. Each of these components may be in communication with one another (e.g., via one or more buses).

The receiver 710 may receive information such as packets, user data, or control information associated with various information channels (e.g., control channels, data channels, and information related to sequence interleaving for conveying multi-bit payloads, etc.). Information may be passed on to other components of the device 705. The receiver 710 may be an example of aspects of the transceiver 920 described with reference to FIG. 10. The receiver 710 may utilize a single antenna or a set of antennas.

The communications manager 715 may be an example of aspects of the communications manager 615 as described herein. The communications manager 715 may include a sequence component 720, an interleaving component 725, a payload component 730, and a decoding component 735. The communications manager 715 may be an example of aspects of the communications manager 910 described herein.

The sequence component 720 may select a sequence from a set of sequences for conveying a payload including a set of bits, where a length of the selected sequence is based on a number of time periods for conveying the payload and a number of frequency tones for conveying the payload. The interleaving component 725 may apply an interleaving function to the selected sequence to generate an interleaved sequence. The payload component 730 may transmit the payload including the set of bits using the interleaved sequence.

The payload component 730 may receive a payload including a set of bits using an interleaved sequence, where a length of the interleaved sequence is based on a number of time periods for conveying the payload and a number of frequency tones for conveying the payload. The interleaving component 725 may apply an interleaving function to de-interleave the interleaved sequence to generate a selected sequence. The decoding component 735 may decode the payload based on the selected sequence.

The transmitter 740 may transmit signals generated by other components of the device 705. In some examples, the transmitter 740 may be collocated with a receiver 710 in a transceiver module. For example, the transmitter 740 may be an example of aspects of the transceiver 920 described with reference to FIG. 10. The transmitter 740 may utilize a single antenna or a set of antennas.

Figure 8:
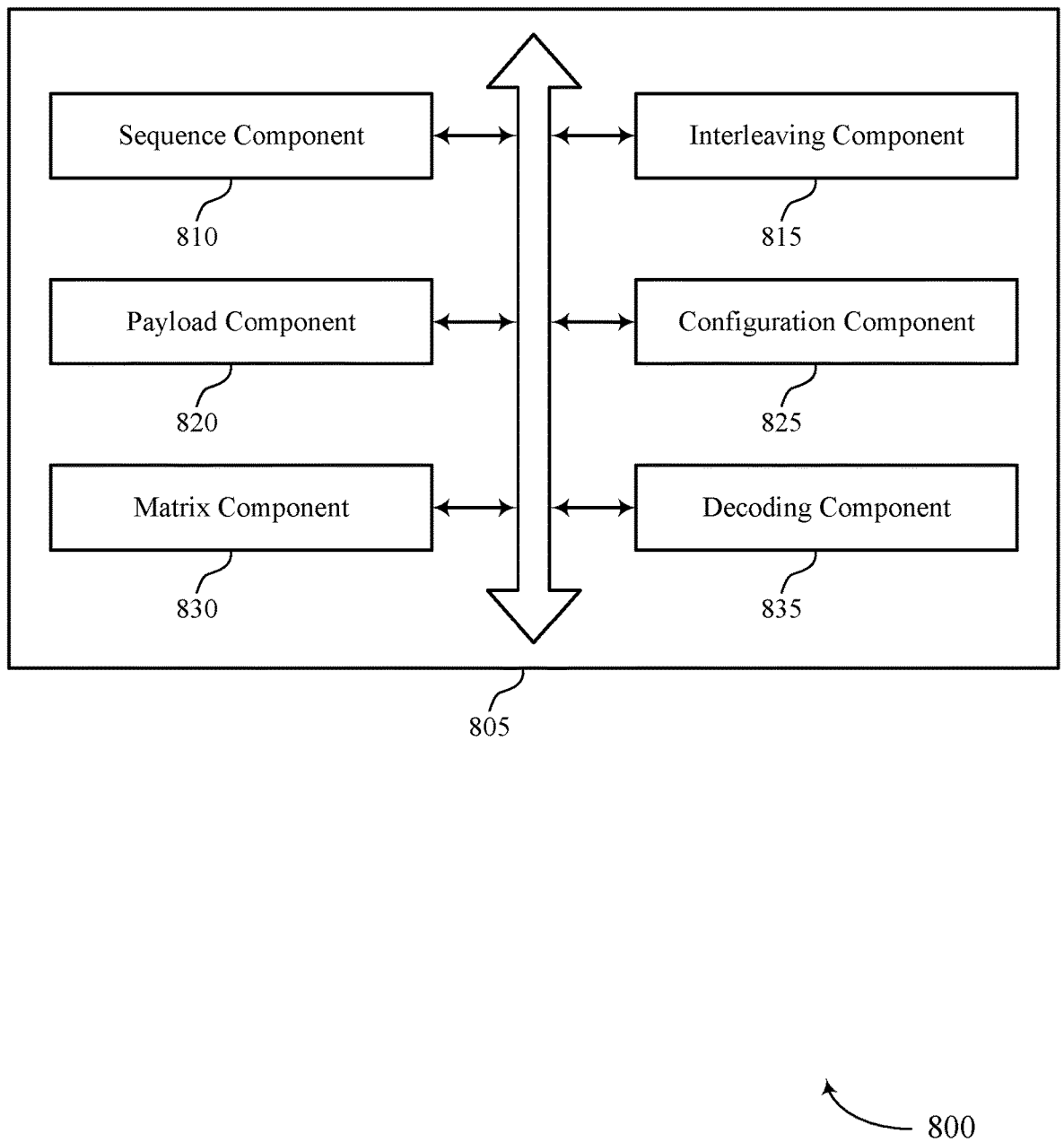
FIG. 8 shows a block diagram of a communications manager that supports sequence interleaving for conveying multi-bit payloads in accordance with aspects of the present disclosure.

FIG. 8 shows a block diagram 800 of a communications manager 805 that supports sequence interleaving for conveying multi-bit payloads in accordance with aspects of the present disclosure. The communications manager 805 may be an example of aspects of a communications manager 615, a communications manager 715, or a communications manager 1010 described herein. The communications manager 805 may include a sequence component 810, an interleaving component 815, a payload component 820, a configuration component 825, a matrix component 830, and a decoding component 835. Each of these modules may communicate, directly or indirectly, with one another (e.g., via one or more buses).

The sequence component 810 may select a sequence from a set of sequences for conveying a payload including a set of bits, where a length of the selected sequence is based on a number of time periods for conveying the payload and a number of frequency tones for conveying the payload. In some examples, the sequence component 810 may generate the set of sequences based on a product of an orthogonal matrix having a size corresponding to the number of time periods and a cyclically shifted cell-specific sequence having a length corresponding to the number of frequency tones, where the set of sequences includes orthogonal sequences. In some cases, the product includes a Kronecker product. In some cases, the orthogonal matrix includes a DFT matrix. In some cases, the set of sequences includes orthogonal sequences or nonorthogonal sequences.

The interleaving component 815 may apply an interleaving function to the selected sequence to generate an interleaved sequence. In some examples, the interleaving component 815 may apply an interleaving function to de-interleave the interleaved sequence to generate a selected sequence. In some examples, the interleaving component 815 may identify the interleaving function based on a table that maps element indices of the selected sequence to element indices of the interleaved sequence. In some examples, the interleaving component 815 may identify the interleaving function based on an equation defining the interleaving function.

In some examples, the interleaving component 815 may map the interleaved sequence to physical resources corresponding to the number of time periods for conveying the payload and the number of frequency tones for conveying the payload. In some examples, the interleaving component 815 may identify the interleaving function based on a table that maps element indices of the selected sequence to element indices of the interleaved sequence. In some examples, the interleaving component 815 may identify the interleaving function based on an equation defining the interleaving function.

The payload component 820 may transmit the payload including the set of bits using the interleaved sequence. In some examples, the payload component 820 may receive a payload including a set of bits using an interleaved sequence, where a length of the interleaved sequence is based on a number of time periods for conveying the payload and a number of frequency tones for conveying the payload. The decoding component 835 may decode the payload based on the selected sequence.

The configuration component 825 may receive signaling that indicates the interleaving function. In some examples, the configuration component 825 may receive configuration signaling that configures interleaving for conveying the payload. In some examples, the configuration component 825 may transmit signaling that indicates the interleaving function. In some examples, the configuration component 825 may transmit configuration signaling that configures interleaving for conveying the payload.

The matrix component 830 may generate, from the selected sequence, a virtual matrix having a number of rows equal to the number of frequency tones for conveying the payload and having a number of columns equal to the number of time periods for conveying the payload. In some examples, the matrix component 830 may apply the interleaving function to elements of the selected sequence within columns of the virtual matrix, where a length of the interleaving function is based on the number of frequency tones for conveying the payload. In some examples, the matrix component 830 may apply the interleaving function to elements of the selected sequence within rows of the virtual matrix, where a length of the interleaving function is based on the number of time periods for conveying the payload.

In some examples, the matrix component 830 may apply the interleaving function to elements of the selected sequence within rows of the virtual matrix and to elements of the selected sequence within columns of the virtual matrix, where a length of the interleaving function is based on a product of the number of time periods for conveying the payload and the number of frequency tones for conveying the payload. In some examples, the matrix component 830 may generate, from the interleaved sequence, a virtual matrix having a number of rows equal to the number of frequency tones for conveying the payload and having a number of columns equal to the number of time periods for conveying the payload.

In some examples, the matrix component 830 may apply the interleaving function to elements of the interleaved sequence within columns of the virtual matrix, where a length of the interleaving function is based on the number of frequency tones for conveying the payload. In some examples, the matrix component 830 may apply the interleaving function to elements of the interleaved sequence within rows of the virtual matrix, where a length of the interleaving function is based on the number of time periods for conveying the payload. In some examples, the matrix component 830 may apply the interleaving function to elements of the interleaved sequence within rows of the virtual matrix and to elements of the interleaved sequence within columns of the virtual matrix, where a length of the interleaving function is based on a product of the number of time periods for conveying the payload and the number of frequency tones for conveying the payload.

Figure 9:
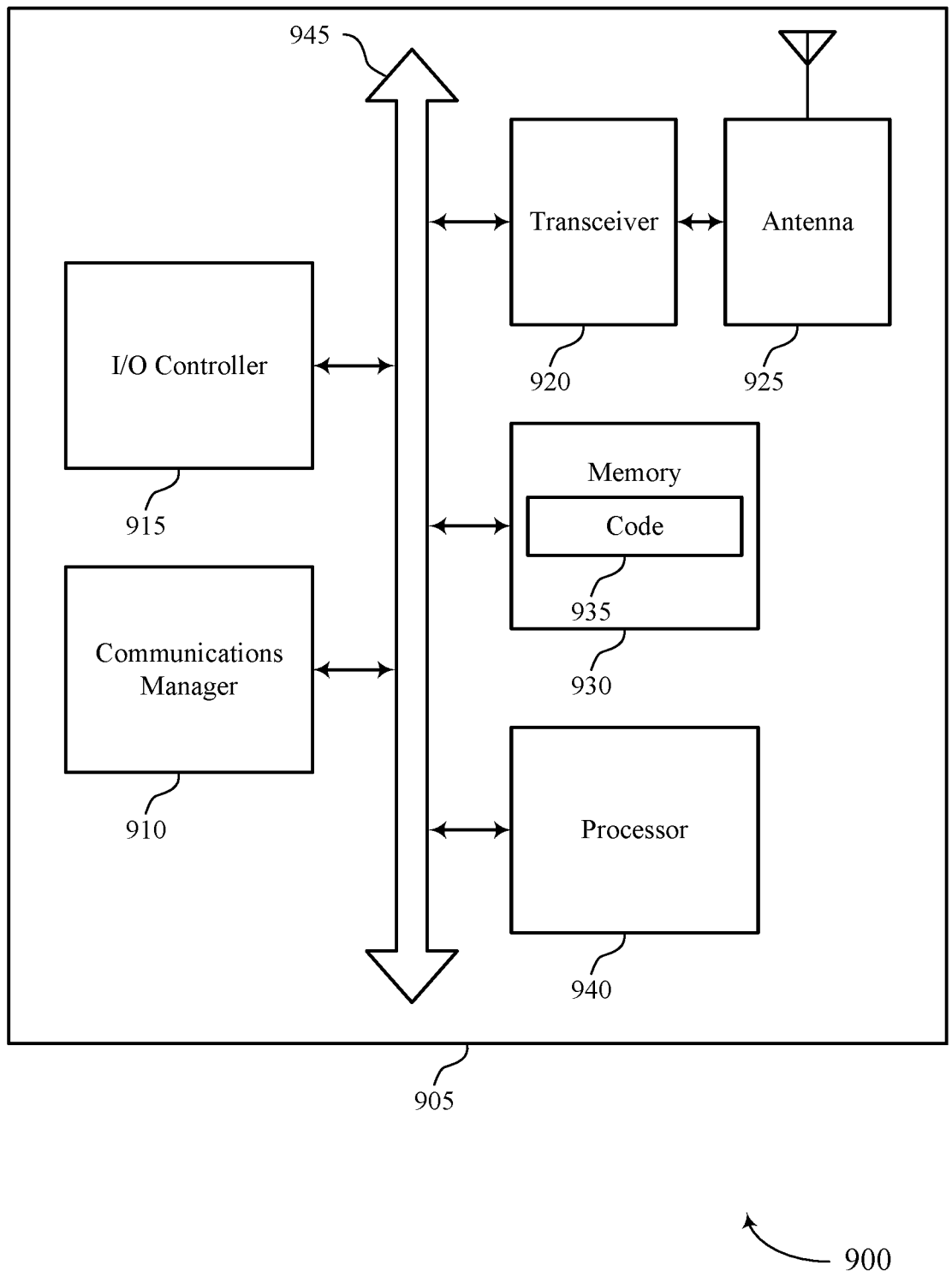
FIG. 9 shows a diagram of a system including a device that supports sequence interleaving for conveying multi-bit payloads in accordance with aspects of the present disclosure.

FIG. 9 shows a diagram of a system 900 including a device 905 that supports sequence interleaving for conveying multi-bit payloads in accordance with aspects of the present disclosure. The device 905 may be an example of or include the components of device 605, device 705, or a device as described herein. The device 905 may include components for bi-directional voice and data communications including components for transmitting and receiving communications, including a communications manager 910, an I/O controller 915, a transceiver 920, an antenna 925, memory 930, a processor 940, and a coding manager 950. These components may be in electronic communication via one or more buses (e.g., bus 945).

The communications manager 910 may select a sequence from a set of sequences for conveying a payload including a set of bits, where a length of the selected sequence is based on a number of time periods for conveying the payload and a number of frequency tones for conveying the payload, apply an interleaving function to the selected sequence to generate an interleaved sequence, and transmit the payload including the set of bits using the interleaved sequence.

The communications manager 910 may also receive a payload including a set of bits using an interleaved sequence, where a length of the interleaved sequence is based on a number of time periods for conveying the payload and a number of frequency tones for conveying the payload, apply an interleaving function to de-interleave the interleaved sequence to generate a selected sequence, and decode the payload based on the selected sequence.

The I/O controller 915 may manage input and output signals for the device 905. The I/O controller 915 may also manage peripherals not integrated into the device 905. In some cases, the I/O controller 915 may represent a physical connection or port to an external peripheral. In some cases, the I/O controller 915 may utilize an operating system such as iOS®, ANDROID®, MS-DOS®, MS-WINDOWS®, OS/2®, UNIX®, LINUX®, or another known operating system. In other cases, the I/O controller 915 may represent or interact with a modem, a keyboard, a mouse, a touchscreen, or a similar device. In some cases, the I/O controller 915 may be implemented as part of a processor. In some cases, a user may interact with the device 905 via the I/O controller 915 or via hardware components controlled by the I/O controller 915.

The transceiver 920 may communicate bi-directionally, via one or more antennas, wired, or wireless links as described above. For example, the transceiver 920 may represent a wireless transceiver and may communicate bi-directionally with another wireless transceiver. The transceiver 920 may also include a modem to modulate the packets and provide the modulated packets to the antennas for transmission, and to demodulate packets received from the antennas. In some cases, the device 905 may include a single antenna 925. However, in some cases, the device 905 may have more than one antenna 925, which may be capable of concurrently transmitting or receiving multiple wireless transmissions.

The memory 930 may include RAM and ROM. The memory 930 may store computer-readable, computer-executable code 935 including instructions that, when executed, cause the processor to perform various functions described herein. In some cases, the memory 930 may contain, among other things, a BIOS which may control basic hardware or software operation such as the interaction with peripheral components or devices.

The code 935 may include instructions to implement aspects of the present disclosure, including instructions to support wireless communications. The code 935 may be stored in a non-transitory computer-readable medium such as system memory or other type of memory. In some cases, the code 935 may not be directly executable by the processor 940 but may cause a computer (e.g., when compiled and executed) to perform functions described herein.

The processor 940 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In other cases, a memory controller may be integrated into the processor 940. The processor 940 may be configured to execute computer-readable instructions stored in a memory (e.g., the memory 930) to cause the device 905 to perform various functions (e.g., functions or tasks supporting sequence interleaving for conveying multi-bit payloads).

Figure 10:
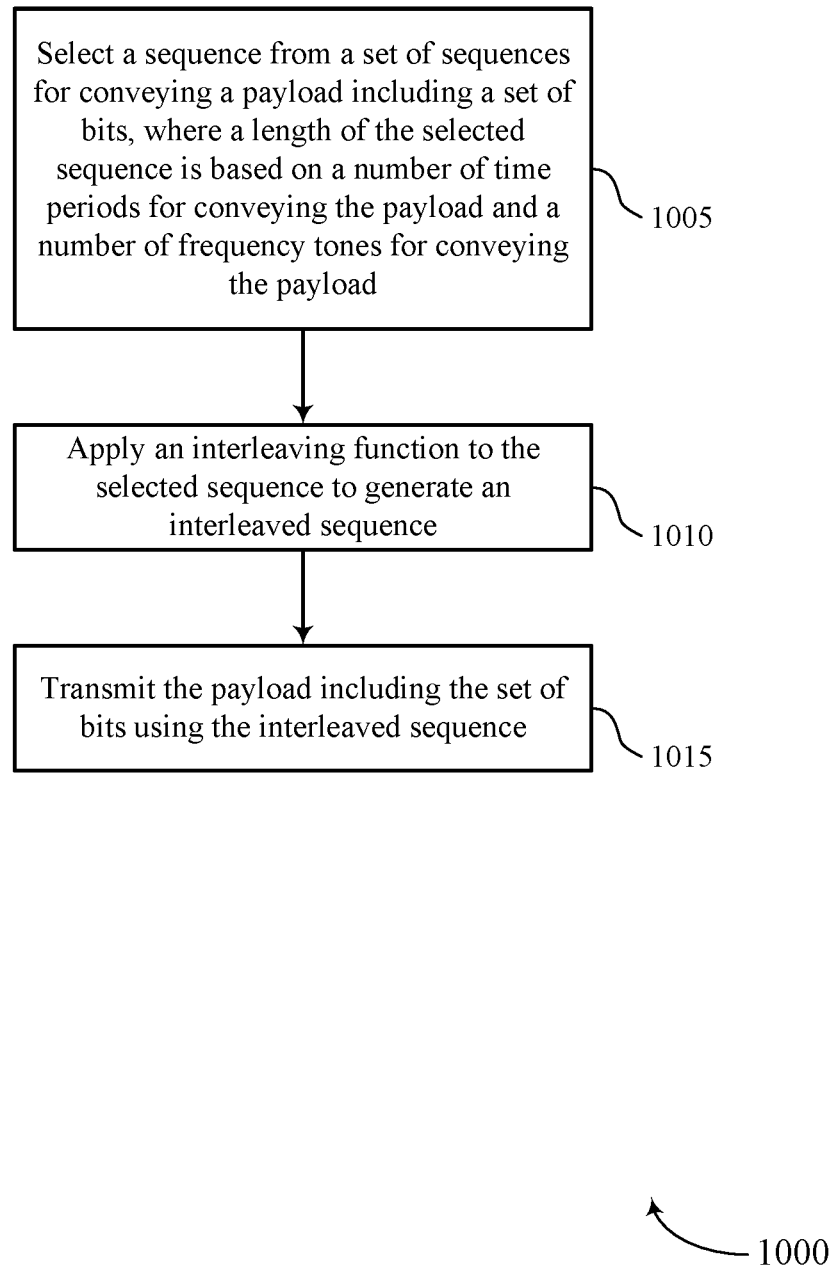
FIGS. 10 through 15 show flowcharts illustrating methods that support sequence interleaving for conveying multi-bit payloads in accordance with aspects of the present disclosure

FIG. 10 shows a flowchart illustrating a method 1000 that supports sequence interleaving for conveying multi-bit payloads in accordance with aspects of the present disclosure. The operations of method 1000 may be implemented by a transmitting device or its components as described herein. For example, the operations of method 1000 may be performed by a communications manager as described with reference to FIGS. 6 through 9. In some examples, a transmitting device may execute a set of instructions to control the functional elements of the transmitting device to perform the functions described below. Additionally or alternatively, a transmitting device may perform aspects of the functions described below using special-purpose hardware.

At 1005, the transmitting device may select a sequence from a set of sequences for conveying a payload including a set of bits, where a length of the selected sequence is based on a number of time periods for conveying the payload and a number of frequency tones for conveying the payload. The operations of 1005 may be performed according to the methods described herein. In some examples, aspects of the operations of 1005 may be performed by a sequence component as described with reference to FIGS. 6 through 9.

At 1010, the transmitting device may apply an interleaving function to the selected sequence to generate an interleaved sequence. The operations of 1010 may be performed according to the methods described herein. In some examples, aspects of the operations of 1010 may be performed by an interleaving component as described with reference to FIGS. 6 through 9.

At 1015, the transmitting device may transmit the payload including the set of bits using the interleaved sequence. The operations of 1015 may be performed according to the methods described herein. In some examples, aspects of the operations of 1015 may be performed by a payload component as described with reference to FIGS. 6 through 9.

Figure 11:
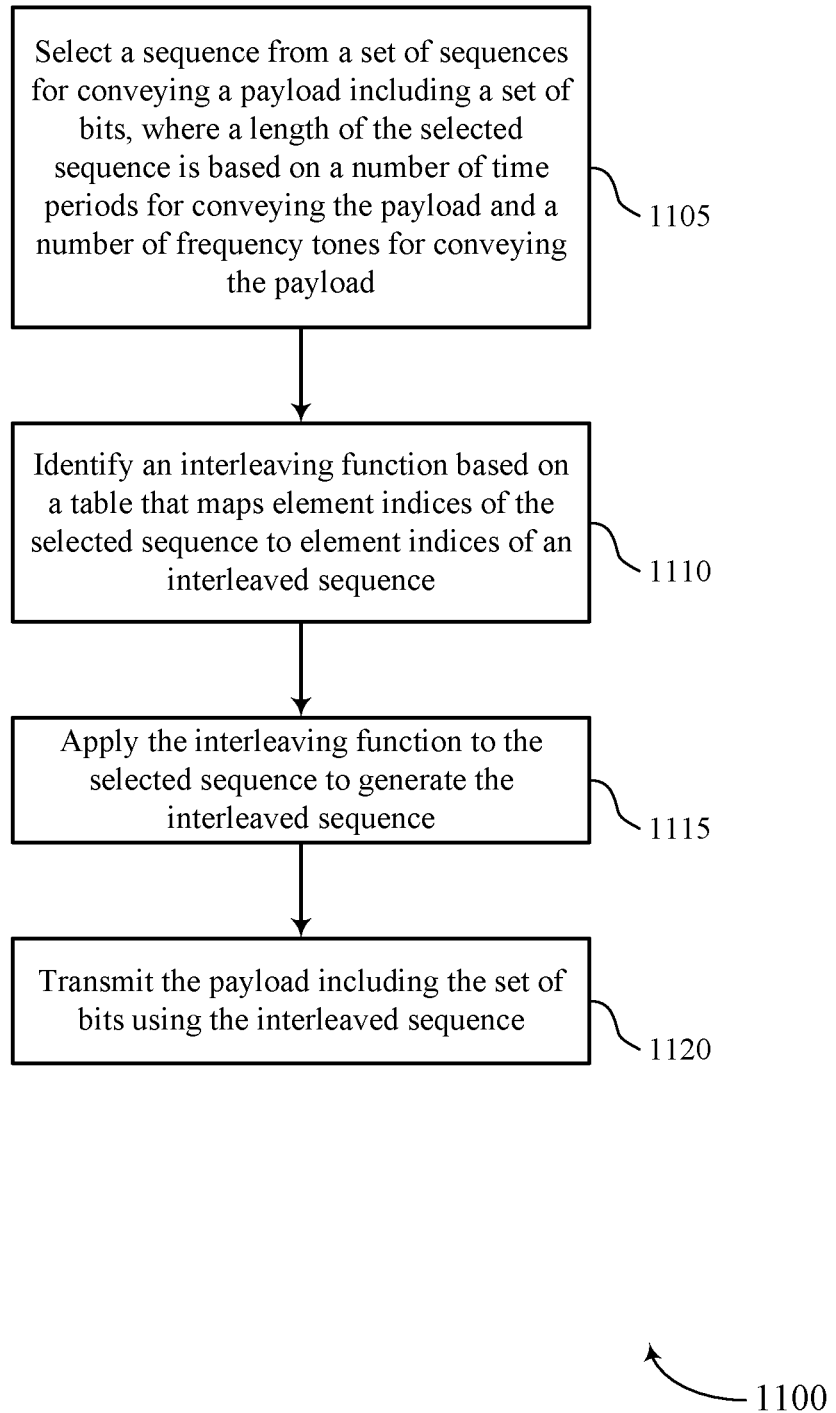

FIG. 11 shows a flowchart illustrating a method 1100 that supports sequence interleaving for conveying multi-bit payloads in accordance with aspects of the present disclosure. The operations of method 1100 may be implemented by a transmitting device or its components as described herein. For example, the operations of method 1100 may be performed by a communications manager as described with reference to FIGS. 6 through 9. In some examples, a transmitting device may execute a set of instructions to control the functional elements of the transmitting device to perform the functions described below. Additionally or alternatively, a transmitting device may perform aspects of the functions described below using special-purpose hardware.

At 1105, the transmitting device may select a sequence from a set of sequences for conveying a payload including a set of bits, where a length of the selected sequence is based on a number of time periods for conveying the payload and a number of frequency tones for conveying the payload. The operations of 1105 may be performed according to the methods described herein. In some examples, aspects of the operations of 1105 may be performed by a sequence component as described with reference to FIGS. 6 through 9.

At 1110, the transmitting device may identify an interleaving function based on a table that maps element indices of the selected sequence to element indices of an interleaved sequence. The operations of 1110 may be performed according to the methods described herein. In some examples, aspects of the operations of 1110 may be performed by an interleaving component as described with reference to FIGS. 6 through 9.

At 1115, the transmitting device may apply the interleaving function to the selected sequence to generate the interleaved sequence. The operations of 1115 may be performed according to the methods described herein. In some examples, aspects of the operations of 1115 may be performed by an interleaving component as described with reference to FIGS. 6 through 9.

At 1120, the transmitting device may transmit the payload including the set of bits using the interleaved sequence. The operations of 1120 may be performed according to the methods described herein. In some examples, aspects of the operations of 1120 may be performed by a payload component as described with reference to FIGS. 6 through 9.

Figure 12:
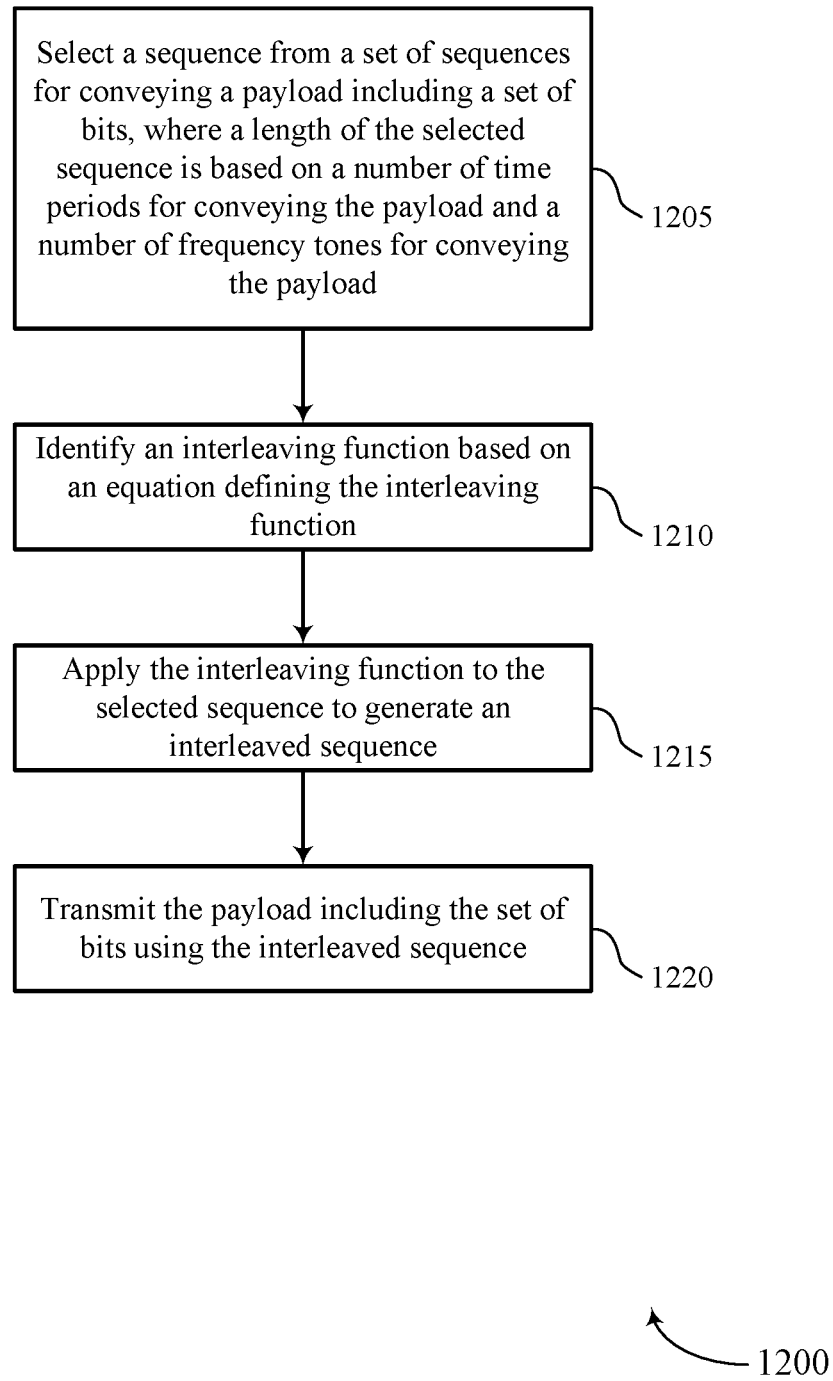

FIG. 12 shows a flowchart illustrating a method 1200 that supports sequence interleaving for conveying multi-bit payloads in accordance with aspects of the present disclosure. The operations of method 1200 may be implemented by a transmitting device or its components as described herein. For example, the operations of method 1200 may be performed by a communications manager as described with reference to FIGS. 6 through 9. In some examples, a transmitting device may execute a set of instructions to control the functional elements of the transmitting device to perform the functions described below. Additionally or alternatively, a transmitting device may perform aspects of the functions described below using special-purpose hardware.

At 1205, the transmitting device may select a sequence from a set of sequences for conveying a payload including a set of bits, where a length of the selected sequence is based on a number of time periods for conveying the payload and a number of frequency tones for conveying the payload. The operations of 1205 may be performed according to the methods described herein. In some examples, aspects of the operations of 1205 may be performed by a sequence component as described with reference to FIGS. 6 through 9.

At 1210, the transmitting device may identify an interleaving function based on an equation defining the interleaving function. The operations of 1210 may be performed according to the methods described herein. In some examples, aspects of the operations of 1210 may be performed by an interleaving component as described with reference to FIGS. 6 through 9.

At 1215, the transmitting device may apply the interleaving function to the selected sequence to generate an interleaved sequence. The operations of 1215 may be performed according to the methods described herein. In some examples, aspects of the operations of 1215 may be performed by an interleaving component as described with reference to FIGS. 6 through 9.

At 1220, the transmitting device may transmit the payload including the set of bits using the interleaved sequence. The operations of 1220 may be performed according to the methods described herein. In some examples, aspects of the operations of 1220 may be performed by a payload component as described with reference to FIGS. 6 through 9.

Figure 13:
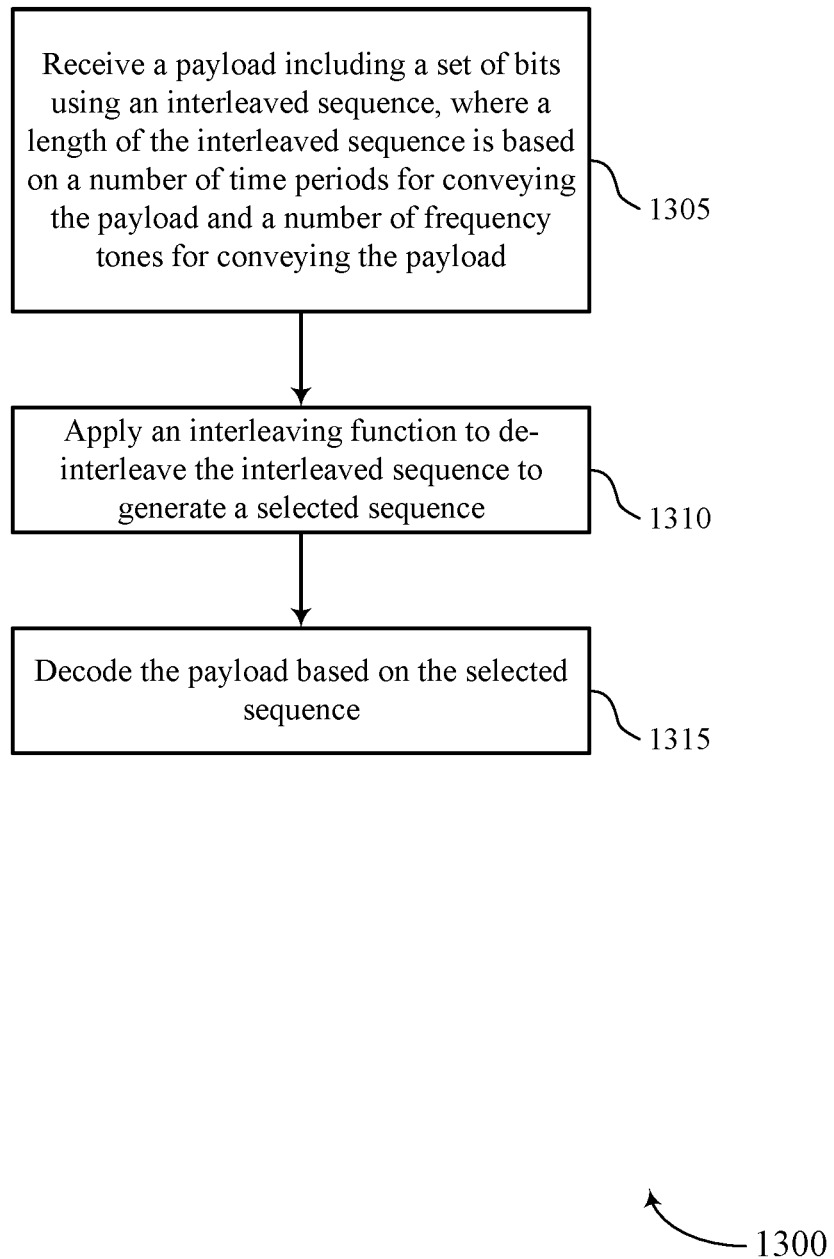

FIG. 13 shows a flowchart illustrating a method 1300 that supports sequence interleaving for conveying multi-bit payloads in accordance with aspects of the present disclosure. The operations of method 1300 may be implemented by a receiving device or its components as described herein. For example, the operations of method 1300 may be performed by a communications manager as described with reference to FIGS. 6 through 9. In some examples, a receiving device may execute a set of instructions to control the functional elements of the receiving device to perform the functions described below. Additionally or alternatively, a receiving device may perform aspects of the functions described below using special-purpose hardware.

At 1305, the receiving device may receive a payload including a set of bits using an interleaved sequence, where a length of the interleaved sequence is based on a number of time periods for conveying the payload and a number of frequency tones for conveying the payload. The operations of 1305 may be performed according to the methods described herein. In some examples, aspects of the operations of 1305 may be performed by a payload component as described with reference to FIGS. 6 through 9.

At 1310, the receiving device may apply an interleaving function to de-interleave the interleaved sequence to generate a selected sequence. The operations of 1310 may be performed according to the methods described herein. In some examples, aspects of the operations of 1310 may be performed by an interleaving component as described with reference to FIGS. 6 through 9.

At 1315, the receiving device may decode the payload based on the selected sequence. The operations of 1315 may be performed according to the methods described herein. In some examples, aspects of the operations of 1315 may be performed by a decoding component as described with reference to FIGS. 6 through 9.

Figure 14:
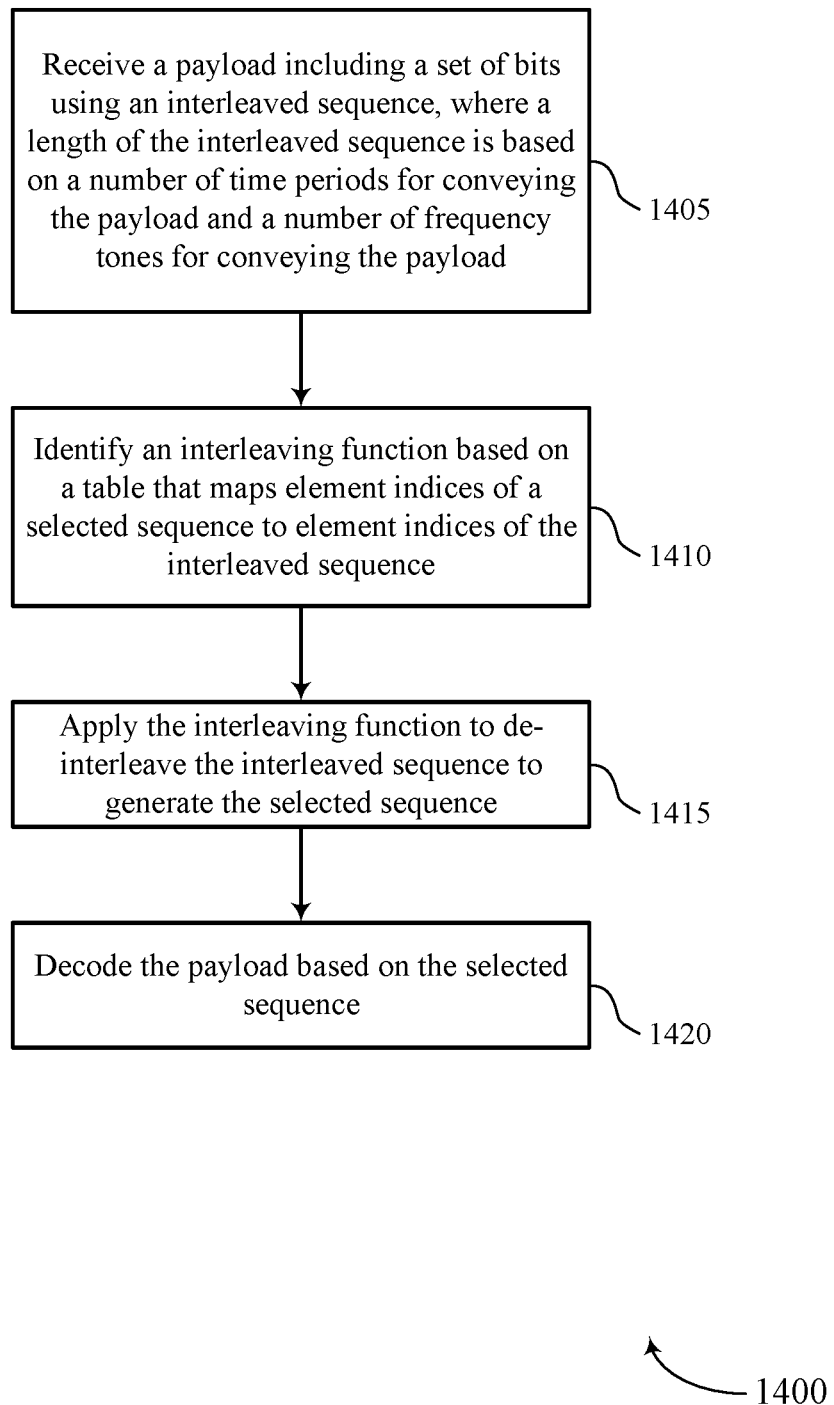

FIG. 14 shows a flowchart illustrating a method 1400 that supports sequence interleaving for conveying multi-bit payloads in accordance with aspects of the present disclosure. The operations of method 1400 may be implemented by a receiving device or its components as described herein. For example, the operations of method 1400 may be performed by a communications manager as described with reference to FIGS. 6 through 9. In some examples, a receiving device may execute a set of instructions to control the functional elements of the receiving device to perform the functions described below. Additionally or alternatively, a receiving device may perform aspects of the functions described below using special-purpose hardware.

At 1405, the receiving device may receive a payload including a set of bits using an interleaved sequence, where a length of the interleaved sequence is based on a number of time periods for conveying the payload and a number of frequency tones for conveying the payload. The operations of 1405 may be performed according to the methods described herein. In some examples, aspects of the operations of 1405 may be performed by a payload component as described with reference to FIGS. 6 through 9.

At 1410, the receiving device may identify an interleaving function based on a table that maps element indices of a selected sequence to element indices of the interleaved sequence. The operations of 1410 may be performed according to the methods described herein. In some examples, aspects of the operations of 1410 may be performed by an interleaving component as described with reference to FIGS. 6 through 9.

At 1415, the receiving device may apply the interleaving function to de-interleave the interleaved sequence to generate the selected sequence. The operations of 1415 may be performed according to the methods described herein. In some examples, aspects of the operations of 1415 may be performed by an interleaving component as described with reference to FIGS. 6 through 9.

At 1420, the receiving device may decode the payload based on the selected sequence. The operations of 1420 may be performed according to the methods described herein. In some examples, aspects of the operations of 1420 may be performed by a decoding component as described with reference to FIGS. 6 through 9.

Figure 15:
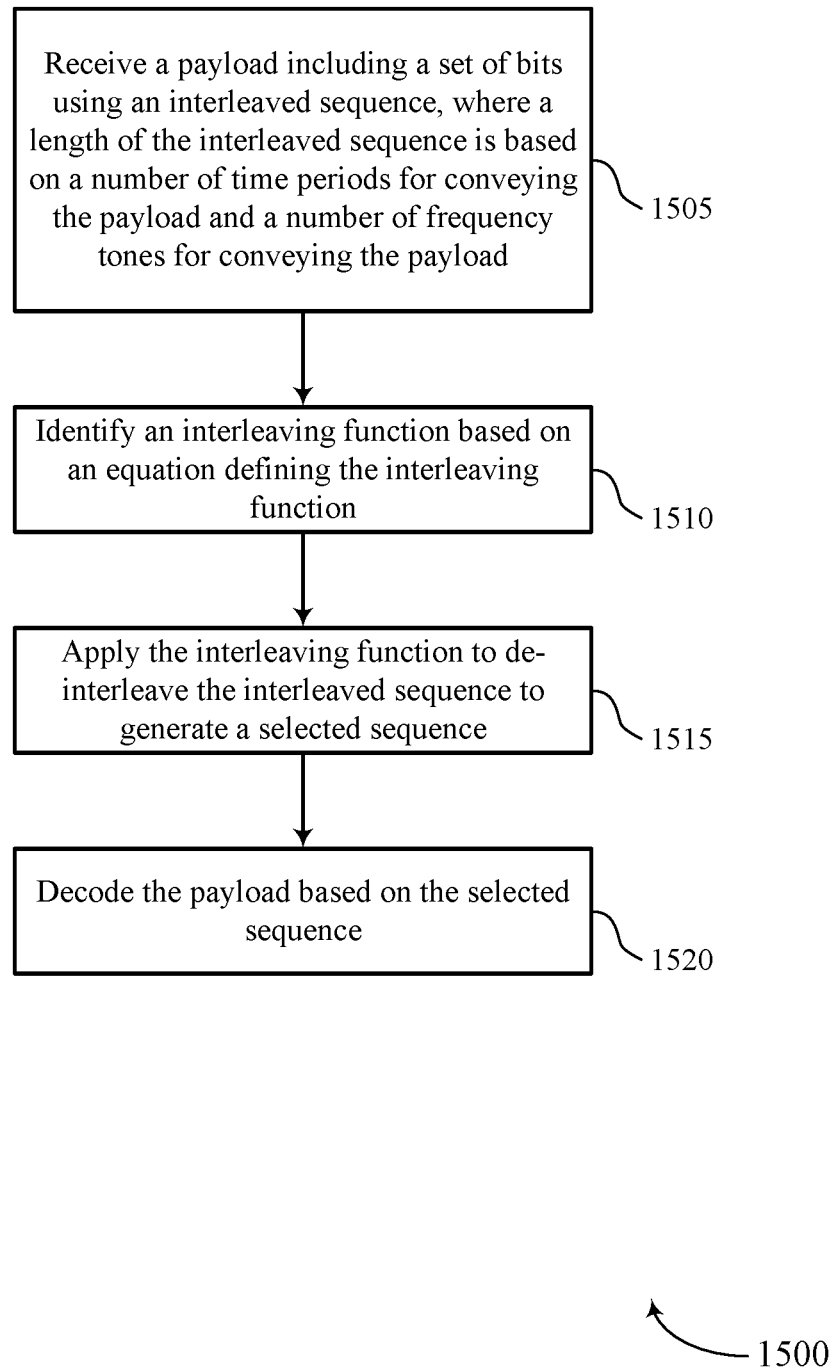

FIG. 15 shows a flowchart illustrating a method 1500 that supports sequence interleaving for conveying multi-bit payloads in accordance with aspects of the present disclosure. The operations of method 1500 may be implemented by a receiving device or its components as described herein. For example, the operations of method 1500 may be performed by a communications manager as described with reference to FIGS. 6 through 9. In some examples, a receiving device may execute a set of instructions to control the functional elements of the receiving device to perform the functions described below. Additionally or alternatively, a receiving device may perform aspects of the functions described below using special-purpose hardware.

At 1505, the receiving device may receive a payload including a set of bits using an interleaved sequence, where a length of the interleaved sequence is based on a number of time periods for conveying the payload and a number of frequency tones for conveying the payload. The operations of 1505 may be performed according to the methods described herein. In some examples, aspects of the operations of 1505 may be performed by a payload component as described with reference to FIGS. 6 through 9.

At 1510, the receiving device may identify an interleaving function based on an equation defining the interleaving function. The operations of 1510 may be performed according to the methods described herein. In some examples, aspects of the operations of 1510 may be performed by an interleaving component as described with reference to FIGS. 6 through 9.

At 1515, the receiving device may apply the interleaving function to de-interleave the interleaved sequence to generate a selected sequence. The operations of 1515 may be performed according to the methods described herein. In some examples, aspects of the operations of 1515 may be performed by an interleaving component as described with reference to FIGS. 6 through 9.

At 1520, the receiving device may decode the payload based on the selected sequence. The operations of 1520 may be performed according to the methods described herein. In some examples, aspects of the operations of 1520 may be performed by a decoding component as described with reference to FIGS. 6 through 9.

The following provides an overview of aspects of the present disclosure:

Aspect 1: A method for wireless communications at a transmitting device, comprising: selecting a sequence from a plurality of sequences for conveying a payload comprising a plurality of bits, wherein a length of the selected sequence is based at least in part on a number of one or more time periods for conveying the payload and a number of one or more frequency tones for conveying the payload; applying an interleaving function to the selected sequence to generate an interleaved sequence; and transmitting the payload comprising the plurality of bits using the interleaved sequence.

Aspect 2: The method of aspect 1, further comprising: identifying the interleaving function based at least in part on a table that maps element indices of the selected sequence to element indices of the interleaved sequence.

Aspect 3: The method of any of aspects 1 through 2, further comprising: identifying the interleaving function based at least in part on an equation defining the interleaving function.

Aspect 4: The method of any of aspects 1 through 3, further comprising: receiving signaling that indicates the interleaving function.

Aspect 5: The method of any of aspects 1 through 4, further comprising: receiving configuration signaling that configures interleaving for conveying the payload.

Aspect 6: The method of any of aspects 1 through 5, further comprising: generating, from the selected sequence, a virtual matrix having a number of rows equal to the number of one or more frequency tones for conveying the payload and having a number of columns equal to the number of one or more time periods for conveying the payload.

Aspect 7: The method of aspect 6, wherein applying the interleaving function to the selected sequence comprises: applying the interleaving function to elements of the selected sequence within columns of the virtual matrix, wherein a length of the interleaving function is based at least in part on the number of one or more frequency tones for conveying the payload.

Aspect 8: The method of any of aspects 6 through 7, wherein applying the interleaving function to the selected sequence comprises: applying the interleaving function to elements of the selected sequence within rows of the virtual matrix, wherein a length of the interleaving function is based at least in part on the number of one or more time periods for conveying the payload.

Aspect 9: The method of any of aspects 6 through 8, wherein applying the interleaving function to the selected sequence comprises: applying the interleaving function to elements of the selected sequence within rows of the virtual matrix and to elements of the selected sequence within columns of the virtual matrix, wherein a length of the interleaving function is based at least in part on a product of the number of one or more time periods for conveying the payload and the number of one or more frequency tones for conveying the payload.

Aspect 10: The method of any of aspects 1 through 9, further comprising: mapping the interleaved sequence to physical resources corresponding to the number of one or more time periods for conveying the payload and the number of one or more frequency tones for conveying the payload.

Aspect 11: The method of any of aspects 1 through 10, further comprising: generating the plurality of sequences based at least in part on a product of an orthogonal matrix having a size corresponding to the number of one or more time periods and a cyclically shifted cell-specific sequence having a length corresponding to the number of one or more frequency tones, wherein the plurality of sequences comprises orthogonal sequences.

Aspect 12: The method of aspect 11, wherein the product comprises a Kronecker product.

Aspect 13: The method of any of aspects 11 through 12, wherein the orthogonal matrix comprises a discrete Fourier transform (DFT) matrix.

Aspect 14: The method of any of aspects 1 through 13, wherein the plurality of sequences comprises orthogonal sequences or nonorthogonal sequences.

Aspect 15: A method for wireless communications at a receiving device, comprising: receiving a payload comprising a plurality of bits using an interleaved sequence, wherein a length of the interleaved sequence is based at least in part on a number of one or more time periods for conveying the payload and a number of one or more frequency tones for conveying the payload; applying an interleaving function to de-interleave the interleaved sequence to generate a selected sequence; and decoding the payload based at least in part on the selected sequence.

Aspect 16: The method of aspect 15, further comprising: identifying the interleaving function based at least in part on a table that maps element indices of the selected sequence to element indices of the interleaved sequence.

Aspect 17: The method of any of aspects 15 through 16, further comprising: identifying the interleaving function based at least in part on an equation defining the interleaving function.

Aspect 18: The method of any of aspects 15 through 17, further comprising: transmitting signaling that indicates the interleaving function.

Aspect 19: The method of any of aspects 15 through 18, further comprising: transmitting configuration signaling that configures interleaving for conveying the payload.

Aspect 20: The method of any of aspects 15 through 19, further comprising: generating, from the interleaved sequence, a virtual matrix having a number of rows equal to the number of one or more frequency tones for conveying the payload and having a number of columns equal to the number of one or more time periods for conveying the payload.

Aspect 21: The method of aspect 20, wherein applying the interleaving function to de-interleave the interleaved sequence to generate the selected sequence comprises: applying the interleaving function to elements of the interleaved sequence within columns of the virtual matrix, wherein a length of the interleaving function is based at least in part on the number of one or more frequency tones for conveying the payload.

Aspect 22: The method of any of aspects 20 through 21, wherein applying the interleaving function to de-interleave the interleaved sequence to generate the selected sequence comprises: applying the interleaving function to elements of the interleaved sequence within rows of the virtual matrix, wherein a length of the interleaving function is based at least in part on the number of one or more time periods for conveying the payload.

Aspect 23: The method of any of aspects 20 through 22, wherein applying the interleaving function to de-interleave the interleaved sequence to generate the selected sequence comprises: applying the interleaving function to elements of the interleaved sequence within rows of the virtual matrix and to elements of the interleaved sequence within columns of the virtual matrix, wherein a length of the interleaving function is based at least in part on a product of the number of one or more time periods for conveying the payload and the number of one or more frequency tones for conveying the payload.

Aspect 24: An apparatus for wireless communications at a transmitting device, comprising a processor; memory coupled with the processor; and instructions stored in the memory and executable by the processor to cause the apparatus to perform a method of any of aspects 1 through 14.

Aspect 25: An apparatus for wireless communications at a transmitting device, comprising at least one means for performing a method of any of aspects 1 through 14.

Aspect 26: A non-transitory computer-readable medium storing code for wireless communications at a transmitting device, the code comprising instructions executable by a processor to perform a method of any of aspects 1 through 14.

Aspect 27: An apparatus for wireless communications at a receiving device, comprising a processor; memory coupled with the processor; and instructions stored in the memory and executable by the processor to cause the apparatus to perform a method of any of aspects 15 through 23.

Aspect 28: An apparatus for wireless communications at a receiving device, comprising at least one means for performing a method of any of aspects 15 through 23.

Aspect 29: A non-transitory computer-readable medium storing code for wireless communications at a receiving device, the code comprising instructions executable by a processor to perform a method of any of aspects 15 through 23.

It should be noted that the methods described herein describe possible implementations, and that the operations and the steps may be rearranged or otherwise modified and that other implementations are possible. Further, aspects from two or more of the implementations may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." Also, as used herein, the phrase "a set" shall be construed as including the possibility of a set with one member. That is, the phrase "a set" shall be construed in the same manner as "one or more."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a transmitting device, comprising:
    selecting a bit sequence from a plurality of bit sequences for conveying a payload comprising a plurality of bits, wherein a length of the selected bit sequence is based at least in part on a number of resource elements of a resource allocation for conveying the payload, the number of resource elements corresponding to a number of one or more time periods for conveying the payload and a number of one or more frequency tones for conveying the payload;
    applying an interleaving function to the selected bit sequence to generate an interleaved bit sequence; and
    transmitting the payload comprising the plurality of bits using the interleaved bit sequence.

2. The method of claim 1, further comprising:
    identifying the interleaving function based at least in part on a table that maps element indices of the selected bit sequence to element indices of the interleaved bit sequence.

3. The method of claim 1, further comprising:
    identifying the interleaving function based at least in part on an equation defining the interleaving function.

4. The method of claim 1, further comprising:
    receiving signaling that indicates the interleaving function.

5. The method of claim 1, further comprising:
    receiving configuration signaling that configures interleaving for conveying the payload.

6. The method of claim 1, further comprising:
    generating, from the selected bit sequence, a virtual matrix having a number of rows equal to the number of one or more frequency tones for conveying the payload and having a number of columns equal to the number of one or more time periods for conveying the payload, wherein elements of the selected bit sequence are included in the virtual matrix and applying the interleaving function to the selected bit sequence is based at least in part on generating the virtual matrix.

7. The method of claim 6, wherein applying the interleaving function to the selected bit sequence comprises:
    applying the interleaving function to elements of the selected bit sequence within columns of the virtual matrix, wherein a length of the interleaving function is based at least in part on the number of one or more frequency tones for conveying the payload.

8. The method of claim 6, wherein applying the interleaving function to the selected bit sequence comprises:
    applying the interleaving function to elements of the selected bit sequence within rows of the virtual matrix, wherein a length of the interleaving function is based at least in part on the number of one or more time periods for conveying the payload.

9. The method of claim 6, wherein applying the interleaving function to the selected bit sequence comprises:
    applying the interleaving function to elements of the selected bit sequence within rows of the virtual matrix and to elements of the selected bit sequence within columns of the virtual matrix, wherein a length of the interleaving function is based at least in part on a product of the number of one or more time periods for conveying the payload and the number of one or more frequency tones for conveying the payload.

10. The method of claim 1, further comprising:
    mapping the interleaved bit sequence to physical resources corresponding to the number of one or more time periods for conveying the payload and the number of one or more frequency tones for conveying the payload.

11. The method of claim 1, further comprising:
    generating the plurality of bit sequences based at least in part on a product of an orthogonal matrix having a size corresponding to the number of one or more time periods and a cyclically shifted cell-specific bit sequence having a length corresponding to the number of one or more frequency tones, wherein the plurality of bit sequences comprises orthogonal sequences.

12. The method of claim 11, wherein the product comprises a Kronecker product.

13. The method of claim 11, wherein the orthogonal matrix comprises a discrete Fourier transform (DFT) matrix.

14. The method of claim 1, wherein the plurality of bit sequences comprises orthogonal sequences or nonorthogonal sequences.

15. A method for wireless communications at a receiving device, comprising:
    receiving a payload comprising a plurality of bits using an interleaved bit sequence, wherein a length of the interleaved bit sequence is based at least in part on a number of resource elements of a resource allocation for conveying the payload, the number of resource elements corresponding to a number of one or more time periods for conveying the payload and a number of one or more frequency tones for conveying the payload;

applying an interleaving function to de-interleave the interleaved bit sequence to generate a selected sequence; and decoding the payload based at least in part on the selected bit sequence.

16. The method of claim 15, further comprising:
identifying the interleaving function based at least in part on a table that maps element indices of the selected bit sequence to element indices of the interleaved bit sequence.

17. The method of claim 15, further comprising:
identifying the interleaving function based at least in part on an equation defining the interleaving function.

18. The method of claim 15, further comprising:
transmitting signaling that indicates the interleaving function.

19. The method of claim 15, further comprising:
transmitting configuration signaling that configures interleaving for conveying the payload.

20. The method of claim 15, further comprising:
generating, from the interleaved bit sequence, a virtual matrix having a number of rows equal to the number of one or more frequency tones for conveying the payload and having a number of columns equal to the number of one or more time periods for conveying the payload, wherein elements of the selected bit sequence are included in the virtual matrix and applying the interleaving function is based at least in part on generating the virtual matrix.

21. The method of claim 20, wherein applying the interleaving function to de-interleave the interleaved bit sequence to generate the selected bit sequence comprises:
applying the interleaving function to elements of the interleaved bit sequence within columns of the virtual matrix, wherein a length of the interleaving function is based at least in part on the number of one or more frequency tones for conveying the payload.

22. The method of claim 20, wherein applying the interleaving function to de-interleave the interleaved bit sequence to generate the selected bit sequence comprises:
applying the interleaving function to elements of the interleaved bit sequence within rows of the virtual matrix, wherein a length of the interleaving function is based at least in part on the number of one or more time periods for conveying the payload.

23. The method of claim 20, wherein applying the interleaving function to de-interleave the interleaved bit sequence to generate the selected bit sequence comprises:
applying the interleaving function to elements of the interleaved bit sequence within rows of the virtual matrix and to elements of the interleaved bit sequence within columns of the virtual matrix, wherein a length of the interleaving function is based at least in part on a product of the number of one or more time periods for conveying the payload and the number of one or more frequency tones for conveying the payload.

24. An apparatus for wireless communications, comprising:
a processor,
memory coupled with the processor; and
instructions stored in the memory and executable by the processor to cause the apparatus to:
select a bit sequence from a plurality of bit sequences for conveying a payload comprising a plurality of bits, wherein a length of the selected bit sequence is based at least in part on a number of resource elements of a resource allocation for conveying the payload, the number of resource elements corresponding to a number of time periods for conveying the payload and a number of frequency tones for conveying the payload;
apply an interleaving function to the selected bit sequence to generate an interleaved bit sequence; and
transmit the payload comprising the plurality of bits using the interleaved bit sequence.

25. The apparatus of claim 24, wherein the instructions are further executable by the processor to cause the apparatus to identify the interleaving function based at least in part on a table that maps element indices of the selected bit sequence to element indices of the interleaved bit sequence.

26. The apparatus of claim 24, wherein the instructions are further executable by the processor to cause the apparatus to generate, from the selected bit sequence, a virtual matrix having a number of rows equal to the number of frequency tones for conveying the payload and having a number of columns equal to the number of time periods for conveying the payload, wherein elements of the selected bit sequence are included in the virtual matrix and applying the interleaving function to the selected bit sequence is based at least in part on generating the virtual matrix.

27. The apparatus of claim 24, wherein the instructions are further executable by the processor to cause the apparatus to generate the plurality of bit sequences based at least in part on a product of an orthogonal matrix having a size corresponding to the number of time periods and a cyclically shifted cell-specific sequence having a length corresponding to the number of frequency tones, wherein the plurality of bit sequences comprises orthogonal sequences.

28. An apparatus for wireless communications, comprising:
a processor,
memory coupled with the processor; and
instructions stored in the memory and executable by the processor to cause the apparatus to:
receive a payload comprising a plurality of bits using an interleaved bit sequence, wherein a length of the interleaved bit sequence is based at least in part on a number of resource elements of a resource allocation for conveying the payload, the number of resource elements corresponding to a number of time periods for conveying the payload and a number of frequency tones for conveying the payload;
apply an interleaving function to de-interleave the interleaved bit sequence to generate a selected bit sequence; and
decode the payload based at least in part on the selected bit sequence.

29. The apparatus of claim 28, wherein the instructions are further executable by the processor to cause the apparatus to identify the interleaving function based at least in part on an equation defining the interleaving function.

30. The apparatus of claim 28, wherein the instructions are further executable by the processor to cause the apparatus to generate from the interleaved bit sequence, a virtual matrix having a number of rows equal to the number of frequency tones for conveying the payload and having a number of columns equal to the number of time periods for conveying the payload, wherein applying the interleaving function to the selected bit sequence is based at least in part on generating the virtual matrix.

* * * * *